(12) United States Patent
Park et al.

(10) Patent No.: US 11,523,507 B2
(45) Date of Patent: Dec. 6, 2022

(54) FLEXIBLE CONNECTION MEMBER AND ELECTRONIC DEVICE COMPRISING SAME

(71) Applicants: Samsung Electronics Co., Ltd., Suwon-si (KR); SI FLEX CO., LTD., Ansan-si (KR)

(72) Inventors: Sungwon Park, Suwon-si (KR); Junghyub Kim, Ansan-si (KR); Hwanyoul Jeong, Ansan-si (KR); Seungyup Lee, Suwon-si (KR); Youngsun Lee, Suwon-si (KR); Hesuk Jung, Suwon-si (KR); Eunseok Hong, Suwon-si (KR)

(73) Assignees: Samsung Electronics Co., Ltd., Suwon-si (KR); SI FLEX CO., LTD., Ansan-si (KR)

( * ) Notice: Subject to any disclaimer, the term of this patent is extended or adjusted under 35 U.S.C. 154(b) by 2 days.

(21) Appl. No.: 17/267,651

(22) PCT Filed: Aug. 9, 2019

(86) PCT No.: PCT/KR2019/010124
§ 371 (c)(1),
(2) Date: Feb. 10, 2021

(87) PCT Pub. No.: WO2020/036383
PCT Pub. Date: Feb. 20, 2020

(65) Prior Publication Data
US 2021/0329784 A1    Oct. 21, 2021

(30) Foreign Application Priority Data
Aug. 14, 2018 (KR) .......................... 10-2018-0095168

(51) Int. Cl.
| | | |
|---|---|---|
| H05K 1/11 | (2006.01) | |
| H05K 1/02 | (2006.01) | |
| H05K 1/14 | (2006.01) | |

(52) U.S. Cl.
CPC ........... *H05K 1/118* (2013.01); *H05K 1/0219* (2013.01); *H05K 1/0237* (2013.01); *H05K 1/147* (2013.01)

(58) Field of Classification Search
CPC .... H05K 1/0219; H05K 1/0237; H05K 1/118; H05K 1/148
See application file for complete search history.

(56) References Cited

U.S. PATENT DOCUMENTS

| 5,889,314 A | * | 3/1999 | Hirabayashi | .......... | H01L 21/763 |
| | | | | | 257/E27.06 |
| 9,590,338 B1 | | 3/2017 | Schmitt et al. | | |

(Continued)

FOREIGN PATENT DOCUMENTS

| JP | 2013-004728 A | 1/2013 |
| KR | 10-2015-0037306 A | 4/2015 |

(Continued)

*Primary Examiner* — Hoa C Nguyen
(74) *Attorney, Agent, or Firm* — Jefferson IP Law, LLP

(57) ABSTRACT

Various embodiments disclosed in the disclosure relate to a flexible connection member and an electronic device comprising same, the flexible connection member having an RF line for signal transmission formed therein, wherein an impedance of the RF line is prevented from being changed even when a flexible printed circuit board is bent. According to one embodiment, a connection member may be provided, the connection member comprising, a first conductive layer including a first logic line, and a second conductive layer in contact with the first conductive layer and including a bonding sheet layer, wherein the second conductive layer includes, a second logic line formed on part of the second conductive layer, and an RF line formed on other part of the (Continued)

second conductive layer, the bonding sheet layer includes, the second conductive layer adhered over the second logic line and the RF line, a first insulating layer formed between the first conductive layer and the second conductive layer, and pins formed on one side of the first conductive layer and the second conductive layer and configured to be electrically connected to connection pins of an external module, and the second conductive layer includes at least one via formed between the second logic line and the RF line so as to energize between the layers included in the second conductive layer. Such a flexible connection member may vary according to embodiments, and an electronic device comprising the flexible connection member may be provided according to various other embodiments.

13 Claims, 13 Drawing Sheets

(56) References Cited

U.S. PATENT DOCUMENTS

| 2012/0318563 | A1 | 12/2012 | Ookawa |
| 2014/0216795 | A1 | 8/2014 | Weichslberger et al. |
| 2017/0280554 | A1* | 9/2017 | Toyoshima ............ H05K 3/384 |
| 2017/0358847 | A1* | 12/2017 | Cho ......................... H05K 1/18 |
| 2018/0063941 | A1 | 3/2018 | Kang |
| 2020/0279815 | A1* | 9/2020 | Huang ................. H01L 23/562 |

FOREIGN PATENT DOCUMENTS

| KR | 10-2017-0063371 A | 6/2017 |
| KR | 10-2017-0133874 A | 12/2017 |
| KR | 10-2018-0005300 A | 1/2018 |
| KR | 10-2018-0024307 A | 3/2018 |
| KR | 10-2018-0037914 A | 4/2018 |

* cited by examiner

FLEXIBLE CONNECTION MEMBER AND ELECTRONIC DEVICE COMPRISING SAME

CROSS-REFERENCE TO RELATED APPLICATION(S)

This application is a National Phase Entry of PCT International Application No. PCT/KR2019/010124, which was filed on Aug. 9, 2019, and claims priority to a Korean Patent Application No. 10-2018-0095168, which was filed on Aug. 14, 2018, in the Korean Intellectual Property Office, the contents of which are incorporated herein by reference.

BACKGROUND

1. Field

Various embodiments disclosed in the disclosure relate to a flexible connection member having a line for transmitting an RF signal, and an electronic device including the same, in which the impedance of an RF line is prevented from being changed even when a structure is bent.

2. Description of the Related Art

Circuit boards may be divided into rigid circuit boards and flexible circuit boards according to their physical characteristics. Recently being used are rigid-flexible circuit boards which are a combination of rigid circuit board and flexible circuit board to enhance the reliability of electrical connection of electronic devices and implement 3D three-dimensional wiring.

In order to meet the demand for wireless data traffic soring since the fourth generation (4G) communication system came to the market, there are ongoing efforts to develop fifth generation (5G) communication systems. In order to achieve a high data rate, the 5G communication system uses ultra-high frequencies of a band of several GHz or more (or referred to as "mmWave communication").

However, the performance of an electronic device including an ultra-high frequency communication module may be influenced by the arrangement state of transmission paths (e.g., wirings) of communication signals due to high frequency characteristics.

SUMMARY

According to some embodiments, multi-layered substrates constituting a flexible circuit board provided in an electronic device may be stacked without bonding to each other. When the structure is bent or deformed, some specific layers may be reversely bent due to a lack of inter-layer bonding in the multi-layered flexible circuit board. The reverse bending may increase loss due to impedance variations in the case where the flexible circuit board region has a high-speed wiring signal line (e.g., an RF signal line).

According to various embodiments of the disclosure, there may be provided a flexible connection member capable of reducing impedance variations as some conductive layers include ground regions on both sides of, and under the signal line, and an electronic device including the flexible connection member.

According to various embodiments of the disclosure, there may be provided a flexible connection member configured to be able to prevent degradation of RF characteristics due to impedance variations even when shape deformation, such as bending, occurs in a flexible circuit board region, and an electronic device including the flexible connection member.

According to various embodiments of the disclosure, there may be provided a connection member comprising a first conductive layer including a first logic line, a second conductive layer positioned adjacent to the first conductive layer and including a bonding sheet layer, the second conductive layer including a second logic line formed on a portion of the second conductive layer and an RF line formed on other portion of the second conductive layer, and the bonding sheet layer adhered onto the second logic line and the RF line, a first insulating layer formed between the first conductive layer and the second conductive layer, and pins formed on a side of the first conductive layer and the second conductive layer and configured to be electrically connected with a connection pin of an external module. the second conductive layer includes at least one via formed between the second logic line and the RF line for conduction between layers included in the second conductive layer.

According to various embodiments of the disclosure, there may be provided a connection member comprising a first conductive layer, a second conductive layer positioned adjacent to the first conductive layer and including an RF line and a bonding sheet layer, the bonding sheet layer including the second conductive layer adhered onto the RF line, a first insulating layer formed between the first conductive layer and the second conductive layer, and pins formed on one side of the first conductive layer and the second conductive layer and configured to be electrically connected with an external module, and at least one via formed through layers included in the first conductive layer and the second conductive layer.

According to various embodiments of the disclosure, there may be provided an electronic device comprising a housing, a first circuit board contained in the housing and including a processor, a second circuit board contained in the housing, including a communication device, and electrically connected with the first circuit board, and a flexible connection member having at least a portion electrically connected with the first circuit board and the second circuit board. The flexible connection member includes a first conductive layer forming a ground and a second conductive layer including an RF line. The second conductive layer includes a bonding sheet layer on the RF line, forming a joined structure on the first conductive layer and the second conductive layer. At least one via is formed through the first conductive layer and the second conductive layer.

A flexible connection member and an electronic device including the flexible connection member, according to various embodiments disclosed in the disclosure, are provided with a bonding sheet between a conductive layer including RF line and a conductive layer positioned above the conductive layer including the RF line, forming a joined structure. Accordingly, it is possible to reduce loss by an implementation capable of reducing RF impedance variations in bending or such deformation.

According to various embodiments of the disclosure, a flexible connection member and an electronic device including the flexible connection member may reduce impedance variations as some conductive layers include a signal line and ground regions on both sides of the signal line and under the signal line in the flexible circuit board region.

According to various embodiments of the disclosure, a flexible connection member and an electronic device including the flexible connection member may reduce loss due to reverse bending, thereby mitigating noise even when a high speed signal line is disposed on the circuit board and stabilizing signal integrity and radio frequency interference (RFI).

DETAILED DESCRIPTION

Hereinafter, embodiments of the disclosure are described with reference to the accompanying drawings.

Figure 1:
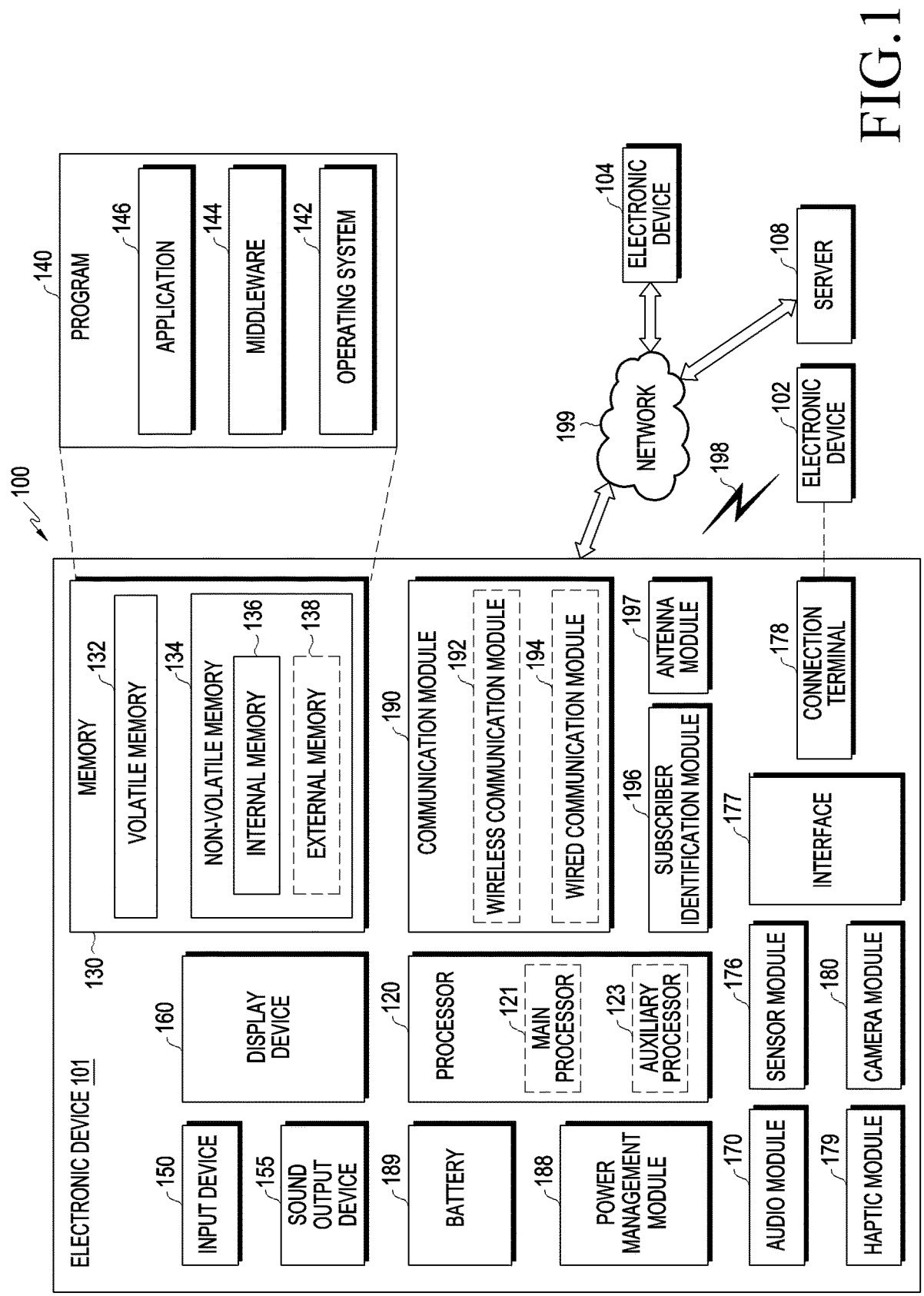
FIG. 1 is a view illustrating an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming call. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN))). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device). According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively," as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
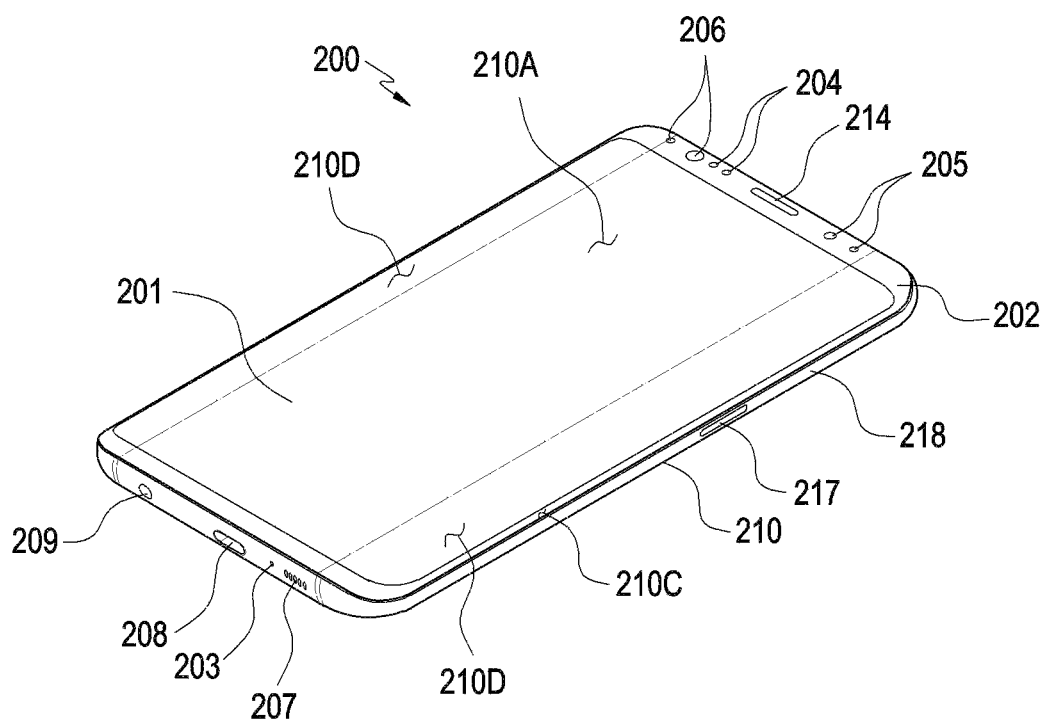
FIG. 2 is a front perspective view illustrating an electronic device according to various embodiments of the disclosure.
Figure 3:
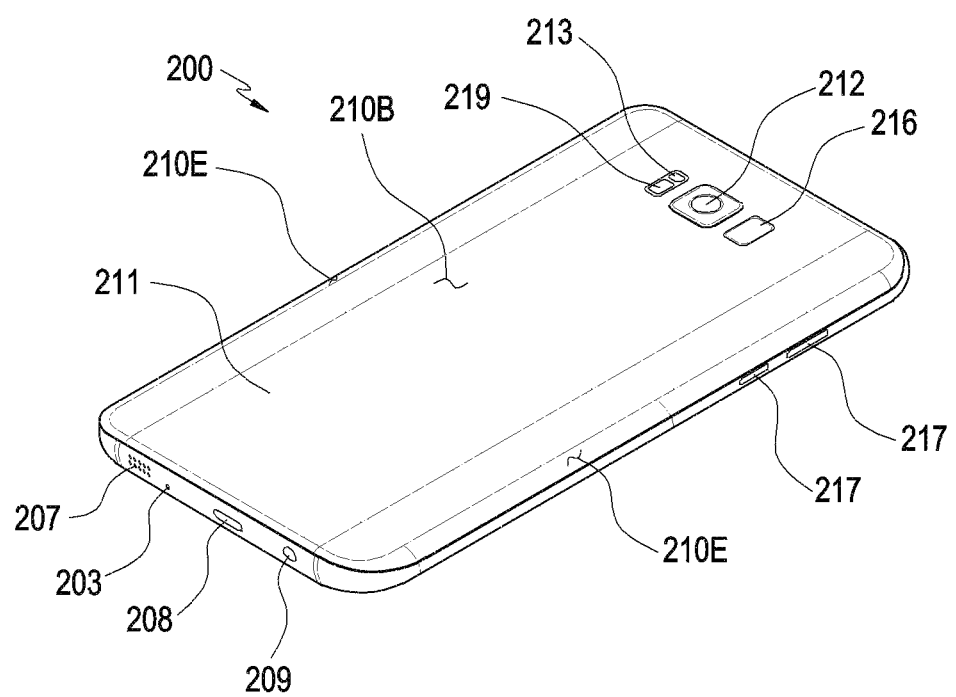
FIG. 3 is a rear perspective view illustrating an electronic device according to various embodiments of the disclosure.

FIG. 2 is a front perspective view illustrating an electronic device 101 according to various embodiments of the disclosure. FIG. 3 is a rear perspective view illustrating an electronic device 101 according to various embodiments of the disclosure.

Referring to FIGS. 2 and 3, according to an embodiment, an electronic device 101 may include a housing 310 with a first (or front) surface 310A, a second (or rear) surface 310B, and a side surface 310C surrounding a space between the first surface 310A and the second surface 310B. According to another embodiment (not shown), the housing may denote a structure forming part of the first surface 310A, the second surface 310B, and the side surface 310C of FIG. 2. According to an embodiment, at least part of the first surface 310A may have a substantially transparent front plate 302 (e.g., a glass plate or polymer plate including various coat layers). The second surface 310B may be formed by a rear plate 311 that is substantially opaque. The rear plate 311 may be formed of, e.g., laminated or colored glass, ceramic, polymer, metal (e.g., aluminum, stainless steel (STS), or magnesium), or a combination of at least two thereof. The side surface 310C may be formed by a side bezel structure (or a "side member") 318 that couples to the front plate 302 and the rear plate 311 and includes a metal and/or polymer. According to an embodiment, the rear plate 311 and the side bezel plate 318 may be integrally formed together and include the same material (e.g., a metal, such as aluminum).

In the embodiment illustrated, the front plate 302 may include two first regions 310D, which seamlessly and bendingly extend from the first surface 310A to the rear plate 311, on both the long edges of the front plate 302. In the embodiment (refer to FIG. 3) illustrated, the rear plate 311 may include two second regions 310E, which seamlessly and bendingly extend from the second surface 310B to the front plate, on both the long edges. In some embodiments, the front plate 302 (or the rear plate 311) may include only one of the first regions 310D (or the second regions 310E). Alternatively, the first regions 310D or the second regions 301E may partially be excluded. According to an embodiment, at side view of the electronic device 101, the side bezel structure 318 may have a first thickness (or width) for sides that do not have the first regions 310D or the second regions 310E and a second thickness, which is smaller than the first thickness, for sides that have the first regions 310D or the second regions 310E.

According to an embodiment, the electronic device 101 may include at least one or more of a display 301, audio modules 303, 307, and 314, sensor modules 304, 316, and 319, camera modules 305, 312, and 313, key input devices 317, a light emitting device 306, and connector holes 308 and 309. According to an embodiment, the electronic device 101 may exclude at least one (e.g., the key input device 317 or the light emitting device 306) of the components or may add other components.

The display 301 may be exposed through the top of, e.g., the front plate 302. According to an embodiment, at least a portion of the display 301 may be exposed through the front plate 302 forming the first surface 310A and the first regions 310D of the side surface 310C. According to an embodiment, the edge of the display 301 may be formed to be substantially the same in shape as an adjacent outer edge of the front plate 302. According to an embodiment (not shown), the interval between the outer edge of the display 301 and the outer edge of the front plate 302 may remain substantially even to give a larger area of exposure the display 301.

According to an embodiment (not shown), the screen display region of the display 301 may have a recess or opening in a portion thereof, and at least one or more of the audio module 314, sensor module 304, camera module 305, and light emitting device 306 may be aligned with the recess or opening. According to an embodiment (not shown), at least one or more of the audio module 314, sensor module 304, camera module 305, fingerprint sensor 316, and light emitting device 306 may be included on the rear surface of the screen display region of the display 301. According to an embodiment (not shown), the display 301 may be disposed to be coupled with, or adjacent, a touch detecting circuit, a pressure sensor capable of measuring the strength (pressure) of touches, and/or a digitizer for detecting a magnetic field-type stylus pen. According to an embodiment, at least part of the sensor modules 304 and 319 and/or at least part of the key input device 317 may be disposed in the first regions 310D and/or the second regions 310E.

The audio modules 303, 307, and 314 may include a microphone hole 303 and speaker holes 307 and 314. The microphone hole 303 may have a microphone inside to obtain external sounds. According to an embodiment, there may be a plurality of microphones to be able to detect the direction of a sound. The speaker holes 307 and 314 may include an external speaker hole 307 and a phone receiver hole 314. According to an embodiment, the speaker holes 307 and 314 and the microphone hole 303 may be implemented as a single hole, or speakers may be rested without the speaker holes 307 and 314 (e.g., piezo speakers).

The sensor modules 304, 316, and 319 may generate an electrical signal or data value corresponding to an internal operating state or external environmental state of the electronic device 101. The sensor modules 304, 316, and 319 may include a first sensor module 304 (e.g., a proximity sensor) and/or a second sensor module (not shown) (e.g., a fingerprint sensor) disposed on the first surface 310A of the housing 310 and/or a third sensor module 319 (e.g., a heart-rate monitor (HRM) sensor) and/or a fourth sensor module 316 (e.g., a fingerprint sensor) disposed on the second surface 310B of the housing 310. The fingerprint sensor may be disposed on the second surface 310A as well as on the first surface 310B (e.g., the display 301) of the housing 310. The electronic device 101 may further include sensor modules not shown, e.g., at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor 304.

The camera modules 305, 312, and 313 may include a first camera device 305 disposed on the first surface 310A of the electronic device 101, and a second camera device 312 and/or a flash 313 disposed on the second surface 310B. The camera modules 305 and 312 may include one or more lenses, an image sensor, and/or an image signal processor. The flash 313 may include, e.g., a light emitting diode (LED) or a xenon lamp. According to an embodiment, two or more lenses (an infrared (IR) camera, a wide-angle lens, and a telescopic lens) and image sensors may be disposed on one surface of the electronic device 101.

The key input device 317 may be disposed on the side surface 310C of the housing 310. According to an embodiment, the electronic device 101 may exclude all or some of the above-mentioned key input devices 317 and the excluded key input devices 317 may be implemented in other forms, e.g., as soft keys, on the display 301. According to an embodiment, the key input device may include the sensor module 316 disposed on the second surface 310B of the housing 310.

The light emitting device 306 may be disposed on, e.g., the first surface 310A of the housing 310. The light emitting device 306 may provide, e.g., information about the state of the electronic device 101 in the form of light. According to an embodiment, the light emitting device 306 may provide a light source that interacts with, e.g., the camera module 305. The light emitting device 306 may include, e.g., a light emitting device (LED), an infrared (IR) LED, or a xenon lamp.

The connector holes 308 and 309 may include a first connector hole 308 for receiving a connector (e.g., a universal serial bus (USB) connector) for transmitting or receiving power and/or data to/from an external electronic device and/or a second connector hole 309 (e.g., an earphone jack) for receiving a connector for transmitting or receiving audio signals to/from the external electronic device.

Figure 4:
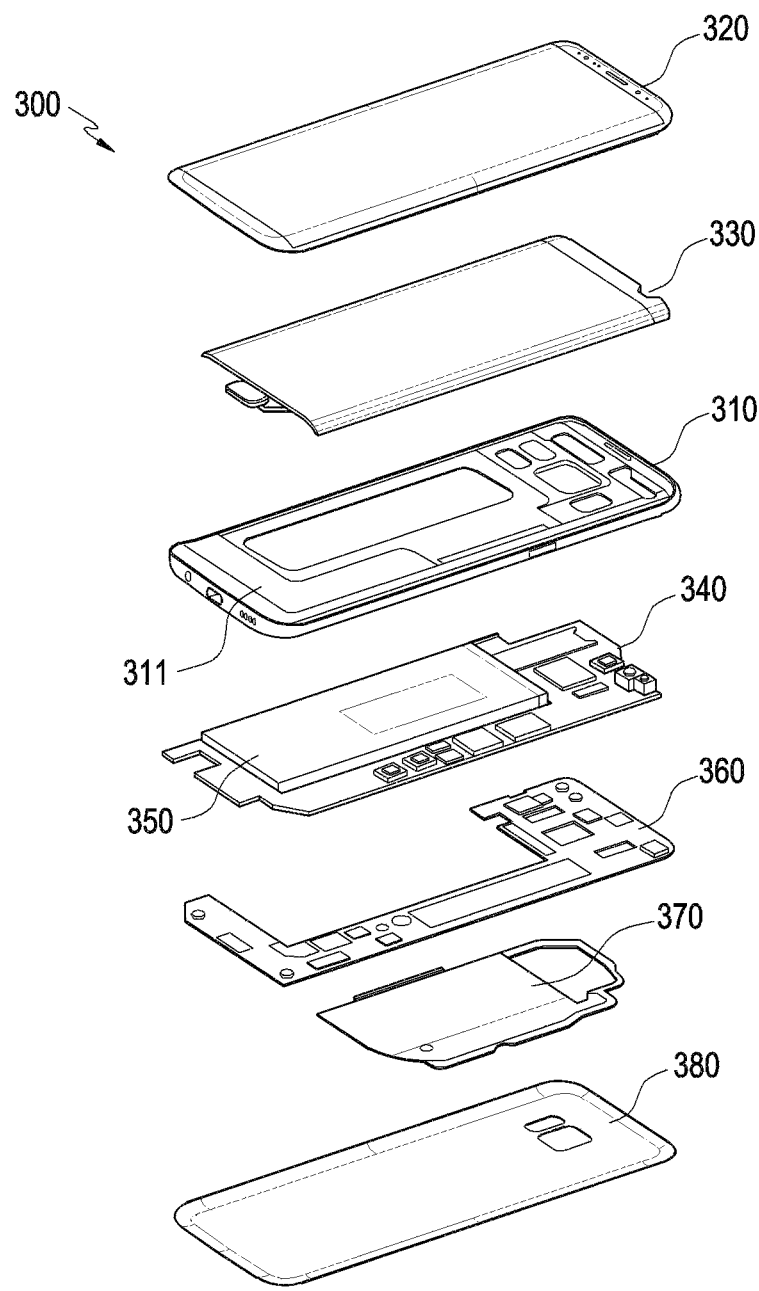
FIG. 4 is an exploded perspective view illustrating an electronic device according to various embodiments of the disclosure.

FIG. 4 is an exploded perspective view illustrating an electronic device 101 according to various embodiments of the disclosure.

Referring to FIG. 4, an electronic device 101 (e.g., the electronic device 101 of FIGS. 1 to 3) may include a side bezel structure 331, a first supporting member 332 (e.g., a bracket), a front plate 320, a display 330, a printed circuit board (PCB) 340, a battery 350, a second supporting member 360 (e.g., a rear case), an antenna 370, and a rear plate 380. According to an embodiment, the electronic device 101 may exclude at least one (e.g., the first supporting member 332 or second supporting member 360) of the components or may add other components. At least one of the components of the electronic device 101 may be the same or similar to at least one of the components of the electronic device 101 of FIG. 2 or 3 and no duplicate description is made below.

The first supporting member 332 may be disposed inside the electronic device 101 to be connected with the side bezel structure 331 or integrated with the side bezel structure 331. The first supporting member 332 may be formed of, e.g., a metal and/or non-metallic material (e.g., polymer). The display 330 may be joined onto one surface of the first supporting member 332, and the printed circuit board 340 may be joined onto the opposite surface of the first supporting member 311. A processor, memory, and/or interface may be mounted on the printed circuit board 340. The processor may include one or more of, e.g., a central processing unit, an application processor, a graphic processing device, an image signal processing, a sensor hub processor, or a communication processor.

The memory may include, e.g., a volatile or non-volatile memory.

The interface may include, e.g., a high definition multimedia interface (HDMI), a universal serial bus (USB) interface, a secure digital (SD) card interface, and/or an audio interface. The interface may electrically or physically connect, e.g., the electronic device 101 with an external electronic device and may include a USB connector, an SD card/multimedia card (MMC) connector, or an audio connector.

The battery 350 may be a device for supplying power to at least one component of the electronic device 101. The battery 189 may include, e.g., a primary cell which is not rechargeable, a secondary cell which is rechargeable, or a fuel cell. At least a portion of the battery 350 may be disposed on substantially the same plane as the printed circuit board 340. The battery 350 may be integrally or detachably disposed inside the electronic device 101.

The antenna 370 may be disposed between the back plate 380 and the battery 350. The antenna 370 may include, e.g., a near-field communication (NFC) antenna, a wireless charging antenna, and/or a magnetic secure transmission (MST) antenna. The antenna 370 may perform short-range communication with, e.g., an external device or may wirelessly transmit or receive power necessary for charging. According to an embodiment, an antenna structure may be formed by a portion or combination of the side bezel structure 331 and/or the first supporting member 332.

Figure 5A:
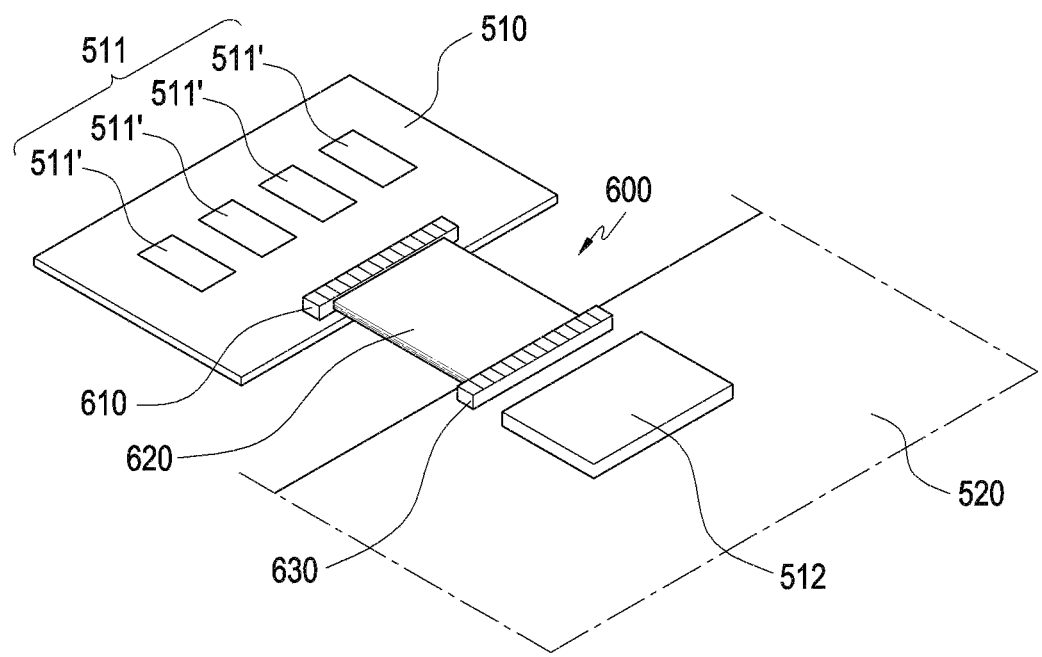
FIG. 5A is a perspective view illustrating first and second circuit boards and a flexible connection member of an electronic device according to various embodiments of the disclosure.
Figure 5B:
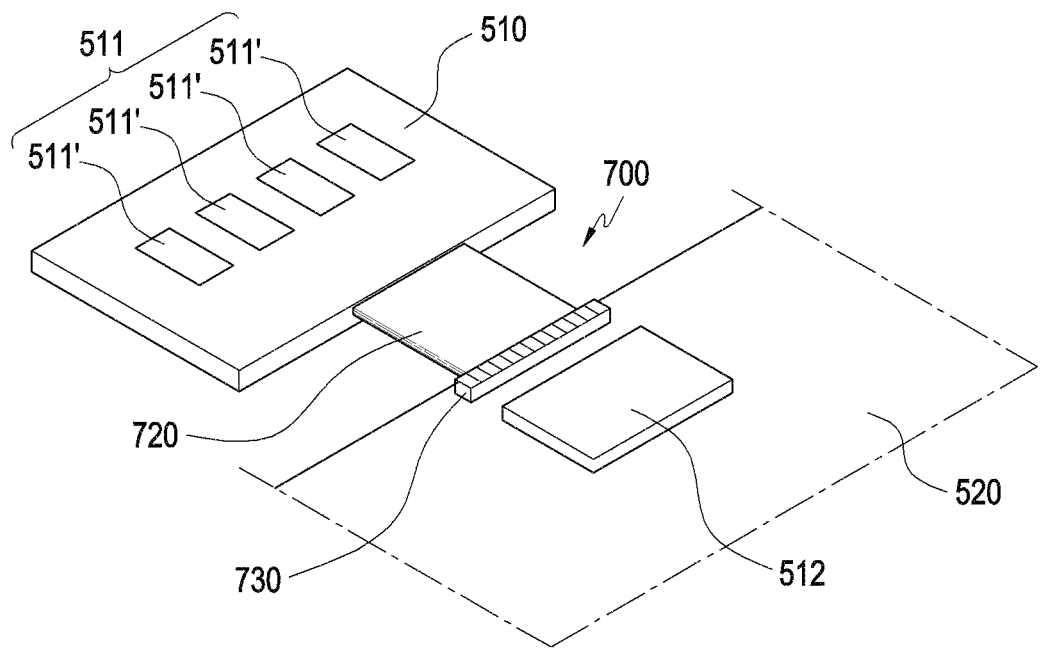
FIG. 5B is a perspective view illustrating first and second circuit boards and a flexible connection member of an electronic device according to other embodiments than those of FIG. 5A.
Figure 5C:
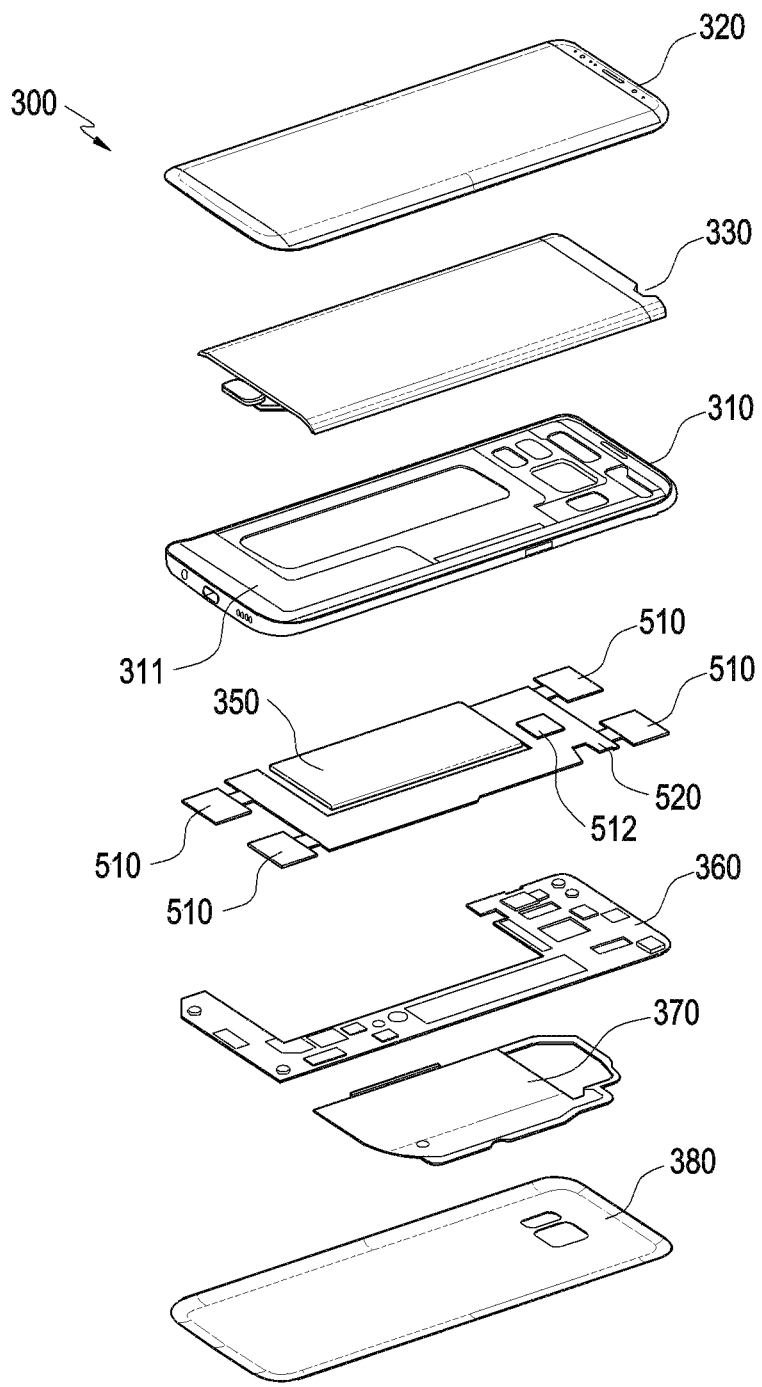
FIG. 5C is an exploded perspective view illustrating an electronic device including a plurality of flexible connection members according to various embodiments of the disclosure.

FIG. 5A is a perspective view illustrating first and second circuit boards 510 and 520 and a flexible connection member 600 of an electronic device (e.g., 101 of FIG. 1) according to various embodiments of the disclosure. FIG. 5B is a perspective view illustrating first and second circuit boards 510 and 520 and a flexible connection member 700 of an electronic device (e.g., 101 of FIG. 1) according to other embodiments than those of FIG. 5A. FIG. 5C is an exploded perspective view illustrating an electronic device 300 (e.g., 101 of FIG. 1) including a plurality of flexible connection members according to various embodiments of the disclosure.

Referring to FIGS. 5A and 5B, the electronic device (e.g., 101 in FIG. 1) may include a flexible connection member 600 or 700 and first and second circuits 510 and 520 disposed on both ends of the flexible connection member 600 or 700, with the flexible connection member 600 or 700 interposed therebetween. According to various embodiments, the flexible connection member 600 or 700 may be configured to make a stable connection or maintain the connection (e.g., electrical connection) between the first circuit board 510 and the second circuit board 520 even when the flexible connection member 600 or 700 is bent in at least some sections thereof.

The structure of the first and second circuit boards 510 and 520 of FIGS. 5A and 5B may be the same in whole or part as the structure of the circuit board 340 of FIG. 4. The second circuit board 520, according to an embodiment, may be a main circuit board (main PCB) including a processor 512 (e.g., the processor 120 of FIG. 1) or a power management module (e.g., a PMIC) or a radio frequency transceiver. The first circuit board 510 may be a sub-circuit board (sub PCB) on which a communication device 511 is mounted, according to an embodiment. Here, the communication device 511 may be, e.g., a millimeter wave (mmWave) communication device that performs wireless communication in a frequency band of 6 GHz or more and 300 GHz or less. According to an embodiment, the communication device 511 and the first circuit board 510 may be formed in a module.

According to various embodiments, the first circuit board 510 may be disposed adjacent to the second circuit board 520 and may be controlled by the processor 512. According to an embodiment, the processor 512 may include, at least, a communication processor, or an integrated configuration of an application processor and a communication processor and may control or drive the wireless transceiver, the power management module, and the wireless communication circuit. The wireless transceiver may be included in the second circuit board 520 and may communicate a Rx digital signal, a transmission analog I/Q signal, and a control signal with the processor 512. In some embodiments, the wireless transceiver may generate a communication signal and provide it to the wireless communication circuit.

According to various embodiments, the communication device 511 mounted on the first circuit board 510 may include at least one radiation conductor 511'. The radiation conductor may have a patch shape, for example. FIGS. 5A and 5B illustrate a rectangular radiation conductor, but without limitations thereto, other various shapes, such as a circle, an ellipse, a rhombus, a triangle, or a polygon may be applied. According to an embodiment, two or more radiation conductors 511' may be combined to form an antenna array. For example, as in the embodiment illustrated in FIGS. 5A and 5B, four radiation conductors 511' may be provided to form a 1×4 array structure. The wireless communication circuit may perform wireless communication using at least one radiation conductor 511' while being controlled by the processor 512.

According to an embodiment, the communication device 511 may be mounted on an upper portion of the first circuit board 510, as in the embodiment illustrated in FIGS. 5A and 5B, but the communication device 511 may be mounted on a lower portion of the first circuit board 510. Further, the communication device 511 may be provided in various positions according to various connection methods of the flexible connection member 600 or 700.

Referring to FIGS. 5A and 5B, the first circuit board 510 may be connected to the second circuit board 520 through the flexible connection member 600 or 700. For example, the flexible connection member 600 or 700 may transmit control signals, power, or communication signals from the second circuit board 520 to the first circuit board 510. In some embodiments, a signal received through the communication device 511 of the first circuit board 510 may be transmitted to the second circuit board 520 through the flexible connection member 600 or 700. According to various embodiments of the disclosure, at least a part of the flexible connection member 600 or 700 may be formed of a flexible printed circuit board (FPCB).

According to various embodiments, the flexible connection member 600 or 700 may be configured to connect a certain circuit board (e.g., the first circuit board 510) with another circuit board (e.g., the second circuit board 520), and the flexible connection member 600 or 700 may also have the same or similar configuration as the circuit board. Further, the flexible connection member 600 or 700 may be implemented as a multi-layered circuit board in which a plurality of conductive layers and a plurality of insulating layers are alternately stacked.

According to various embodiments, the flexible connection member 600 or 700 may include at least one electrically conductive path connecting the first circuit board 510 and the second circuit board 520. For example, the conductive path may be formed on at least one of the plurality of conductive layers to transfer power or a control signal provided from the power management module or the processor. In some embodiments, the flexible connection member 600 or 700 may include a conductive path (e.g., RF line) for transferring the communication signal provided form the RF transceiver or the communication signal received through the communication device 511 to the RF transceiver. These conductive path(s) may also be formed on at least one of the plurality of conductive layers.

According to various embodiments, the flexible connection member 600 or 700 may include means for connecting to at least one of the first circuit board 510 and the second circuit board 520. According to an embodiment, connection ends 610 and 630 may be formed on at least one of both ends of the flexible connection member 600 or 700 as in the embodiment illustrated in FIG. 5A so as to connect to at least one of the first circuit board 510 and the second circuit board 520. Here, the connection ends 610 and 630 may include a receptacle or a header having at least one pin.

The flexible connection member 600 or 700 may be connected to at least one of the first circuit board 510 or the second circuit board 520 through various other means as well as a receptacle or header structure. For example, the flexible connection member 600 or 700 may be connected with at least one of the first circuit board 510 or the second circuit board 520 through a bonding part formed through a thermal compression-based hot-bar process. The shape and manufacturing method of the connection ends 610 and 620 are not limited to any specific embodiment.

According to various embodiments, the flexible connection member 600 or 700 may include, e.g., a flexible printed circuit (FPC) or flexible flat cable (FFC) type, a board to board (B to B) type connector structure, a zip type connector structure, a bonding type connector structure formed through a hot bar process, a low insertion force (LIF) connector structure, or a zero insertion force (ZIF) connector structure depending on the shape of the connection ends 610 and 620.

According to another embodiment, the flexible connection member 600 or 700 may extend from a portion of the first circuit board 510 or the second circuit board 520. As in the embodiment illustrated in FIG. 5B, at least one side of the flexible connection member 600 or 700 extends from at least one of the first circuit board 510 or the second circuit board 520 and may thus connect to the first circuit board 510 or the second circuit board 520. Here, the flexible connection member 600 or 700 may extend, integrally with at least one of the first circuit board 510 and the second circuit board 520.

Referring to FIG. 5C, disclosed is an electronic device 300 including a plurality (e.g., four) of flexible connection members (e.g., 600 and 700 of FIGS. 5A and 5B) according to various embodiments. The first circuit board 510 connected to each of the flexible connection members may include a communication device (e.g., 511 of FIG. 5A) and may be electrically connected with a processor (e.g., 512 of FIG. 5A) provided on the second circuit board 520. Here, the first circuit board 511 may include a plurality of antenna radiators, and the second circuit board 520 may correspond to a main PCB including the processor. Further, the flexible connection member may include a flexible printed circuit board (FPCB) on which wiring for a next generation mobile communication system of an ultra-high frequency band is formed.

According to some embodiments, when at least a portion (e.g., 620 of FIG. 5A) of the flexible connection member 600 or 700 is formed of a flexible printed circuit board, if this portion (e.g., 620 of FIG. 5A) is bent, a conductive path (e.g., RF line) formed on the flexible connection member 600 or 700 may be spaced apart from a ground portion provided for grounding of the conductive path in the flexible connection member 600 or 700. Accordingly, the impedance of the communication signals provided from the RF transceiver using the flexible connection member 600 or 700 or the communication signals received through the communication device 511 may be varied.

Hereinafter, the flexible connection member 600 or 700 according to various embodiments for preventing a change in impedance is described with reference to FIGS. 6A to 8B.

Figure 6A:
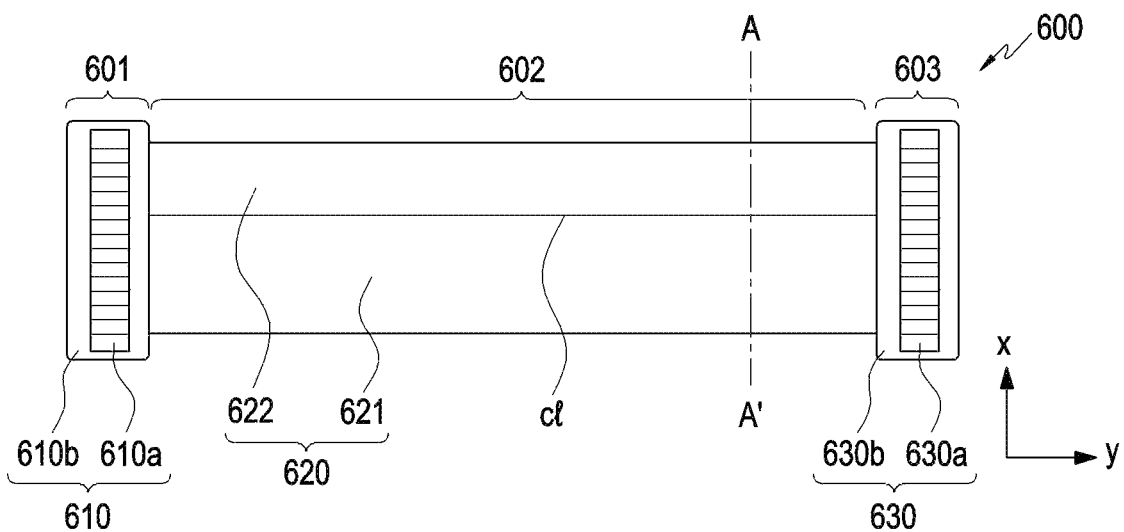
FIG. 6A is a view illustrating a flexible connection member having a pin on at least one side as viewed from above an upper surface according to various embodiments of the disclosure.

FIG. 6A is a view illustrating a flexible connection member 600 having a pin on at least one side as viewed from over an upper surface according to various embodiments of the disclosure.

Figure 6B:
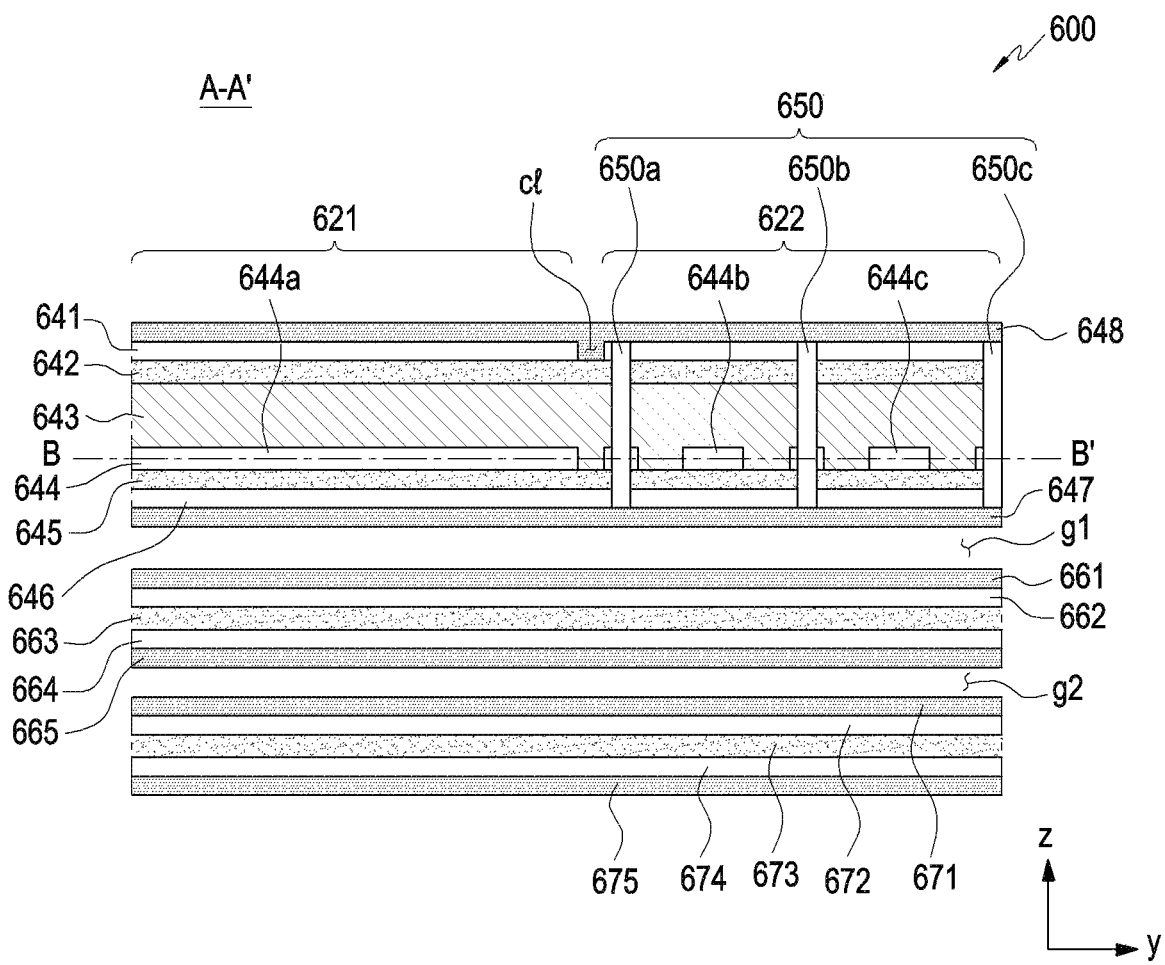
FIG. 6B is a cross-sectional view of the flexible connection member of FIG. 6A, taken along line A-A'.
Figure 6C:
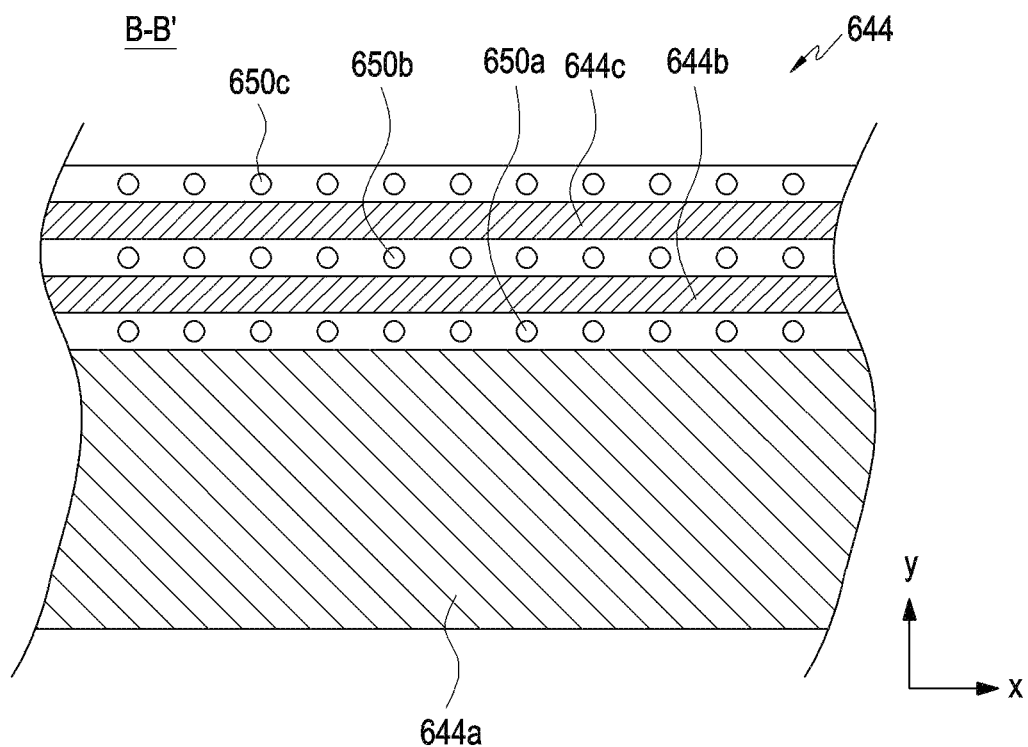
FIG. 6C is a cross-sectional view of the flexible connection member of FIG. 6B taken in the direction B-B'.

FIG. 6B is a cross-sectional view of the flexible connection member 600 of FIG. 6A, taken along line A-A'. FIG. 6C is a cross-sectional view of the flexible connection member 600 of FIG. 6B taken in the direction B-B'. In the embodiments of FIGS. 6A to 6C, disclosed is a flexible connection member including a flexible substrate 620 and two connection ends 610 and 630.

In the following figures including FIGS. 6A to 6C, the direction component x illustrated at a coordinate axis may denote the length direction of the flexible connection member 600, and the direction component y may denote the width direction of the flexible connection member 600. The direction component z may denote the height direction of the flexible connection member 600.

Referring to FIG. 6A, the flexible connection member 600 may be divided into rigid portions 601 and 603 to be fastened to the circuit boards (e.g., 510 and 520 of FIG. 5A) along the length direction and a flex portion 602 disposed between the rigid portions 601 and 603. The rigid portions 601 and 603 may include a first rigid portion 601 and a second rigid portion 603. The first rigid portion 601 may include a first connection end 610, and the first connection end 610 may include a plurality of pins 610a and a reinforcing material 610b surrounding the plurality of pins 610a. The second rigid portion 603 may include a second connection end 630, and the second connection end 630 may include a plurality of pins 630a and a reinforcing material 630b surrounding the plurality of pins 630a. The first connection end 610 may include the plurality of pins 610a and the reinforcing member 610b and may have a structure like a receptacle or a header. Similarly, the second connection end 630 may include the plurality of pins 630a and the reinforcing member 630b and may have a structure, like a receptacle or a header. According to another embodiment, the first connection end 610 and the second connection end 630 may have a shape of a bonding part through, e.g., a hot-bar process.

According to various embodiments, the first rigid portion 601 and the second rigid portion 603 may form the same layer and the same structure. However, without limitations thereto, the first rigid portion 601 and the second rigid portion 603 may form various arrangements and various layered structures. In the drawings, the first rigid portion 601 and the second rigid portion 603 are shown to have a symmetrical shape, but are not necessarily limited thereto.

Hereinafter, the first rigid portion 601 and the flex portion 602 are described, and the description of the second rigid portion 603 may be applied to the first rigid portion 601.

According to various embodiments, the flex portion 602 may include a wiring portion 620. The wiring portion 620 may include a first region 621 and a second region 622 having different lines along the width direction of the flexible connection member 600. According to an exemplary embodiment, different logic lines may be formed in the first region 621 and the second region 622. According to another embodiment, a radio frequency (RF) line may be formed in the second region 622. According to an embodiment, the first region 621 and the second region 622 may be separated through a predetermined gap cl, as in the embodiment illustrated in FIG. 6A. According to an embodiment, the first region 621 and the second region 622 may be insulated through the gap cl.

According to various embodiments, the first rigid portion 601 and the flex portion 602 each may include a plurality of conductive layers and a plurality of insulating layers divided into layers, and each of the conductive layers and the insulating layers may integrally extend from the rigid portion 601 and the flex portion 602.

FIG. 6B illustrates a layered structure of the flex portion 602 including a plurality of conductive layers and insulating layers.

According to various embodiments of the disclosure, the flex portion 602 may include a first conductive layer 641, a second conductive layer 644, and a first insulating layer 642 formed between the first conductive layer 641 and the second conductive layer 644. A first logic line may be formed on the first conductive layer 641, and a second logic line may be formed on the second conductive layer 644. The first conductive layer 641, the first insulating layer 642, and the second conductive layer 644 may be sequentially stacked along the height direction of the flexible connection member 600. The top surface of the first conductive layer 641 may be an externally visible portion of the wiring portion 620 of the flexible connection member 600, and the top surface of the second conductive layer 644 may be covered by the first conductive layer 641 and the first insulating layer 642. According to an embodiment, as is described below, the top surface of the first conductive layer 641 may also be covered by a coverlay (e.g., a sixth coverlay 648).

According to various embodiments of the disclosure, the second conductive layer 644 may include a bonding sheet layer 643. As referred to by the reference numeral, the bonding sheet layer 643 may be a portion of the second conductive layer 644, which contacts the first insulating layer 642. The bonding sheet layer 643 may be formed to surround the second logic line formed on the second conductive layer 644, and may form a joined structure between the second insulating layer 642 and the second conductive layer 644.

According to various embodiments of the disclosure, the second conductive layer 644 may include an RF line. According to an embodiment, the RF line may be disposed on the same plane as the second logic line formed on the second conductive layer 644. Further, according to an embodiment, when the RF line is disposed on the same plane as the second logic line, the second logic line 644a may be disposed in the first region 621, and the RF line 644b may be disposed in the second region 622. According to various embodiments, two or more RF lines 644b and 644c may be disposed on the same plane in the second conductive layer 644.

As in the above-described embodiment, when the second conductive layer 644 includes the bonding sheet layer 643, the upper surface of the bonding sheet layer 643 may be adhered to the first insulating layer 642, and the lower surface of the bonding sheet layer 643 may be adhered to the second logic line and the RF line.

According to various embodiments, the second insulating layer 645 may be formed under the second conductive layer 644, and the third conductive layer 646 may be formed under the second insulating layer 645. Looking again at the layered structure according to the above-described embodiments, the flexible connection member 600 may form a stacked structure (hereinafter, referred to as a "first stacked structure") including the first conductive layer 641, the first insulating layer 642 disposed in contact between the first conductive layer 641 and the second conductive layer 644, the second conductive layer 644, and the second insulating layer 645 disposed in contact between the second conductive layer 644 and the third conductive layer 646.

According to various embodiments, the first insulating layer 642 and the second insulating layer 645 may be a polyimide (PI)-based base layer, such as a flexible copper clad laminate (FCCL). Accordingly, the stacked structure may be formed as a stacked plate in which a thin metal plate (e.g., copper (Cu)) is laminated on at least one surface of a polyimide (PI)-based base layer. As another example, a thin copper plate may be layered on the top or bottom of the PI-based base layer, and a copper-plated film may then be layered thereon. As another example, an ink layer may be coated on the top surface of the copper-plated film circuit, protecting the circuit.

According to various embodiments of the disclosure, since the bonding sheet layer 643 is formed on the second conductive layer 644 including the RF line, such a structure may be provided that the layer including the RF line is more firmly adhered.

According to various embodiments, a plurality of conductive layers and a plurality of insulating layers may be included in addition to the above-described first stacked structure. For example, as in the embodiment illustrated in FIG. 6B, there may be included a fourth conductive layer 662, a fifth conductive layer 664, and a third insulating layer 663 disposed in contact between the fourth conductive layer 662 and the fifth conductive layer 664. Further, as in the embodiment illustrated in FIG. 6B, there may be included a sixth conductive layer 672, a seventh conductive layer 674, and a fourth insulating layer 673 disposed in contact between the sixth conductive layer 672 and the seventh conductive layer 674.

According to various embodiments, a second stacked structure may be formed by including the fourth conductive layer 662, the fifth conductive layer 664, and the third insulating layer 663 disposed in contact between the fourth conductive layer 662 and the fifth conductive layer 664, and a third stacked structure may be formed by including the sixth conductive layer 672, the seventh conductive layer 674, and the fourth insulating layer 673 disposed in contact between the sixth conductive layer 672 and the seventh conductive layer 674. Logic lines may be formed on the conductive layers included in the second and third stacked structures, providing various signal transmission paths. Of course, additional stacked structures may be formed.

According to various embodiments, the first stacked structure, the second stacked structure, and the third stacked structure (hereinafter, referred to as "stacked structures") may be spaced apart from each other (by gaps g1 and g2). Accordingly, the flexible connection member may be flexibly bent even though it has a multi-layered substrate structure. However, to provide electrical insulation between the stacked structures and protect the wiring from physical impacts, a coverlay may be formed on the surfaces of the stacked structures. The coverlay may include a coverlay film and cover resin layers layered on both surfaces of the coverlay film. The coverlay film may include a polyimide (PI) resin formed of an electrical insulating layer. For example, the PI resin may be a high thermal-resistant resin produced by preparing a polyamic acid derivative by solution-polymerizing aromatic dianhydride with aromatic diamine or aromatic diisocyanate and ring-closing dehydrating to imidize it at high temperature to imidize. Thus, the PI resin, as an insoluble, infusible ultra-high thermal-resistant resin, may have superior properties in thermal oxidation resistance, thermal resistance, radiation resistance, low-temperature characteristics, or chemical resistance.

Referring to FIG. 6B, a first coverlay 647 may be included under the first stacked structure, and a second coverlay 661 and a third coverlay 665, respectively, may be included over the second stacked structure and under the second stacked structure. A fourth coverlay 671 and a fifth coverlay 675 may be included over the third stacked structure and under the third stacked structure, respectively. The flexible connection member 600 as disclosed in the disclosure may have other coverlay arrangement structures according to various embodiments. According to an embodiment, in addition to the coverlays formed between the stacked structures, a sixth coverlay 648 covering the top of the first stacked structure may be added to protect the wiring from external physical impacts, as illustrated in FIG. 6B.

Referring to FIGS. 6B and 6C, the flexible connection member 600 according to various embodiments of the disclosure may include at least one via. It is generally known that vias used for electrical conduction between a conductive layer and another conductive layer in a multi-layered printed circuit board are difficult to form in a flexible printed circuit board (FPCB). The flexible connection member 600, according to various embodiments of the disclosure, may additionally include the bonding sheet layer 643 to form a joined structure, thereby rendering it easy to form at least one via between the conductive layers. According to an embodiment, a via may be formed through the first conductive layer 641 and the second conductive layer 644. Accordingly, it is possible to electrically conduct between the layers included in the first conductive layer 641 and the second conductive layer 644. According to an embodiment, a via penetrating the first conductive layer 641 and the third conductive layer 644 may be formed. In this case, the first conductive layer 641 and the third conductive layer 644 may be electrically connected through the at least one via.

As in the embodiment illustrated in FIG. 6C, at least one via 650a may be formed between the second logic line 644a and the RF line 644b. According to various embodiments, when two or more RF lines 644b and 644c are provided, at least one via 650b may be additionally included between the two or more RF lines 644b and 644c. According to an embodiment, at least one via 650c may be additionally included around a certain RF line 644c. When a plurality of vias 650a, 650b, and 650c are provided, the vias may be formed at substantially regular intervals.

According to various embodiments, a ground may be formed in at least a portion of the plurality of conductive layers included in the flexible connection member 600. For example, a ground may be formed on either the first conductive layer 641 or the third conductive layer 646, or the first conductive layer 641 and the third conductive layer 646 may be formed as a ground. Here, by forming at least one via 650a through which the first conductive layer 641 and the third conductive layer 646 conduct, the first conductive layer 641 and the third conductive layer 646 may form a stable ground state. Accordingly, an electromagnetic shielding structure may be formed around the RF line 644b.

According to the above-described embodiments, a joined structure including the bonding sheet layer 643 formed on the flexible connection member 600 may be formed, and thus, at least one via 650a may be formed therein. By forming an electromagnetic shielding structure around the RF line 644b through at least one via 650a, it is possible to reduce or prevent changes in the impedance of the RF line.

Figure 7A:
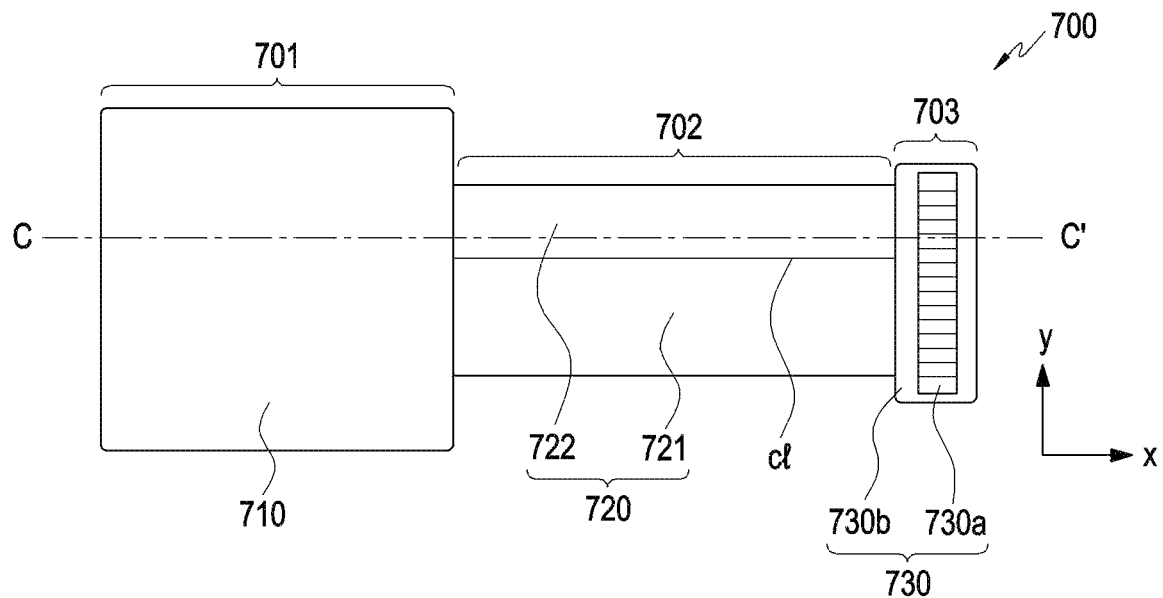
FIG. 7A is a view illustrating a flexible connection member having at least one side connected with a rigid circuit board, as viewed from above an upper surface, according to various embodiments of the disclosure.
Figure 7B:
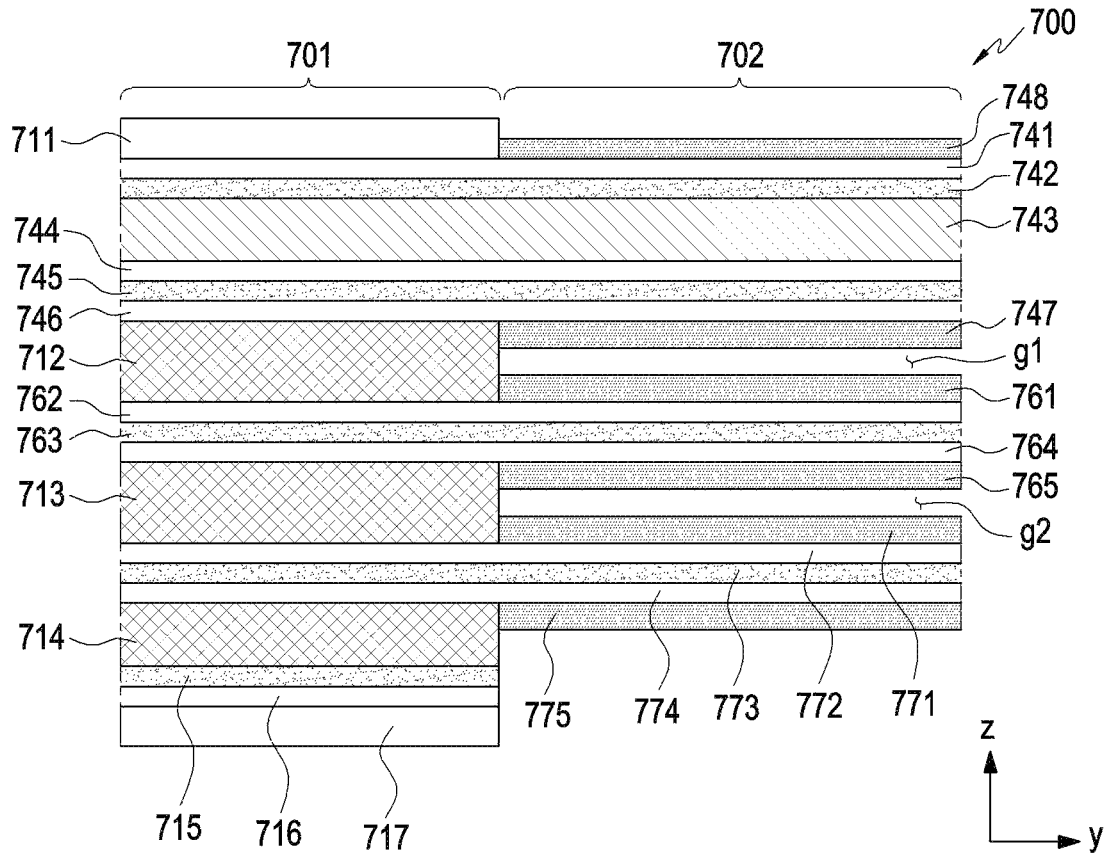
FIG. 7B is a cross-sectional view of the flexible connection member of FIG. 7A, taken along line C-C'.

FIG. 7A is a view illustrating a flexible connection member 700 having at least one side connected with a rigid circuit board (e.g., the first circuit board), as viewed from above an upper surface, according to various embodiments of the disclosure. FIG. 7B is a cross-sectional view of the flexible connection member 700 of FIG. 7A, taken along line C-C'. The flexible connection member 700 according to the embodiment illustrated in FIGS. 7A and 7B may have at least one side integrally connected with a rigid circuit board (e.g., 510 or 520 of FIG. 5A).

Referring to FIG. 7A, the flexible connection member 700 may be divided into rigid portions 701 and 703 to be fastened to the circuit boards (e.g., 510 and 520 of FIG. 5A) along the length direction and a flex portion 702 disposed between the rigid portions 701 and 703. The rigid portions 701 and 703 may include a first rigid portion 701 and a second rigid portion 703. According to an embodiment, as in the embodiment illustrated in FIG. 7A, at least one rigid portion (e.g., the first rigid portion 701) may be integrally connected with a circuit board (e.g., 510 or 520 of FIG. 5A), another rigid portion (the second rigid portion 703) has a second connection end 730, and the second connection end 730 may include a plurality of pins 730a and a reinforcing material 730b surrounding the plurality of pins 730a.

According to another embodiment, both the first rigid portion 701 and the second rigid portion 703 of the flexible connection member 700 may be integrally connected with the circuit board (e.g., 510 and 520 of FIG. 5A). In this case, the second connection end 730 may be omitted.

Hereinafter, the first rigid portion 701 and the flex portion 702 are described, and the description of the second rigid portion 703 may be applied to the first rigid portion 701.

According to various embodiments, the flex portion 702 may include a wiring portion 720. The wiring portion 720 may include a first region 721 and a second region 722 having different lines along the width direction of the flexible connection member 700. According to an exemplary embodiment, different logic lines may be formed in the first region 721 and the second region 722. According to another embodiment, a radio frequency (RF) line may be formed in the second region 722. According to an embodiment, the first region 721 and the second region 722 may be separated through a predetermined gap (e.g., cl of FIG. 6A). According to an embodiment, the first region 721 and the second region 722 may be insulated through the gap (e.g., cl of FIG. 6A).

According to various embodiments, the first rigid portion 701 and the flex portion 702 each may include a plurality of conductive layers and a plurality of insulating layers divided into layers, and each of the conductive layers and the insulating layers may integrally extend from the rigid portion 701 and the flex portion 702.

FIG. 7B illustrates a layered structure of a flex portion 702 and a first rigid portion 701 including a plurality of conductive layers and insulating layers. The difference from FIG. 6B is that FIG. 6B illustrates a cross section cut in the width direction of the flexible connection member 600 whereas FIG. 7B illustrates a cross section cut in the length direction of the flexible connection member 700.

According to various embodiments of the disclosure, the flex portion 702 may include a first conductive layer 741, a second conductive layer 744, and a first insulating layer 742 formed between the first conductive layer 741 and the second conductive layer 742. A first logic line may be formed on the first conductive layer 741, and a second logic line may be formed on the second conductive layer 744. The first conductive layer 741, the first insulating layer 742, and the second conductive layer 744 may be sequentially stacked along the height direction of the flexible connection member 700. The top surface of the first conductive layer 741 may be an externally visible portion of the wiring portion 720 of the flexible connection member 700, and the top surface of the second conductive layer 744 may be covered by the first conductive layer 741 and the first insulating layer 742.

According to various embodiments of the disclosure, the second conductive layer 744 may include a bonding sheet layer 743. As referred to by the reference numeral, the bonding sheet layer 743 may be a portion of the second conductive layer 744, which contacts the first insulating layer 742. The bonding sheet layer 743 is formed to surround the second logic line (e.g., 644a of FIG. 6A) and the RF line (e.g., 644b of FIG. 6A) formed on the second conductive layer 744, and a joined structure between the first insulating layer 742 and the second conductive layer 744 may be formed. The upper surface of the bonding sheet layer 743 may be adhered to the first insulating layer 742, and the lower surface of the bonding sheet layer 743 may be adhered to the second logic line (e.g., 644a of FIG. 6A) and the RF line (e.g., 644b of FIG. 6A).

According to various embodiments, the second insulating layer 745 may be formed under the second conductive layer 744, and the third conductive layer 746 may be formed under the second insulating layer 745. The flexible connection member 700 may form a stacked structure (hereinafter, referred to as a "first stacked structure") including the first conductive layer 741, the first insulating layer 742 disposed in contact between the first conductive layer 741 and the second conductive layer 744, the second conductive layer 744, and the second insulating layer 745 disposed in contact between the second conductive layer 744 and the third conductive layer 746.

According to various embodiments, a plurality of conductive layers and a plurality of insulating layers may be included in addition to the above-described stacked structure. For example, as in the embodiment illustrated in FIG. 7B, there may be included a fourth conductive layer 762, a fifth conductive layer 764, and a third insulating layer 763 disposed in contact between the fourth conductive layer 762 and the fifth conductive layer 764, forming a second stacked structure. Further, as in the embodiment illustrated in FIG. 7B, there may be included a sixth conductive layer 772, a seventh conductive layer 774, and a fourth insulating layer 773 disposed in contact between the sixth conductive layer 772 and the seventh conductive layer 774, forming a third stacked structure. Logic lines may be formed on the conductive layers included in the second and third stacked structures, providing various signal transmission paths. Of course, additional stacked structures may be formed.

According to various embodiments, the first stacked structure, the second stacked structure, and the third stacked structure may be spaced apart from each other (by gaps g1 and g2). Accordingly, the flexible connection member 700 may be flexibly bent even though it has a multi-layered substrate structure. However, to provide electrical insulation between the stacked structures and protect the wiring from physical impacts, a coverlay may be formed on the surfaces of the stacked structures.

Referring to FIG. 7B, a first coverlay 747 may be included under the first stacked structure, and a second coverlay 761 and a third coverlay 765, respectively, may be included over the second stacked structure and under the second stacked structure. A fourth coverlay 771 and a fifth coverlay 775 may be included over the third stacked structure and under the third stacked structure, respectively. The flexible connection member 700 as disclosed in the disclosure may have other coverlay arrangement structures according to various embodiments. According to an embodiment, a sixth coverlay 748 covering the top of the first stacked structure may be added to protect the wiring from external physical impacts, as illustrated in FIG. 7B.

According to an embodiment, the first rigid portion 701 may include photo solder resists (PSR) 711 and 717 covering the surface of the conductive layer. Further, according to an embodiment, the first rigid portion 701 may further include at least one conductive layer 716 and at least one insulating layer 715 not included in the flex portion 702.

According to various embodiments, bending deformation of the first rigid portion 701 may be relatively limited as compared with the flex portion 702. For example, the first rigid portion 701 may further include prepregs 712, 713, and 714 obtained by impregnating a glass fabric or a glass mat with a catalyst-applied unsaturated polyester resin to form a gel. For example, the prepregs 712, 713, and 714 may be disposed adjacent to at least some layers of the third conductive layer 746, the fourth conductive layer 762, or the fifth conductive layer 764, the sixth conductive layer 772, the seventh conductive layer of the first rigid portion 701. As compared to the flex portion 702 that forms a coverlay on the surface with a gap (e.g., g1, g2) between the stacked structures, the first rigid portion 701 which is formed of a plurality of layers by repeating the method of applying an adhesive material and then compressing copper thin films and insulating layers such as prepregs, may have high resistance to deformation and high rigidity.

According to some embodiments, a via may be formed in the first rigid portion 701. However, in contrast to the first rigid portion 701, the flex portion 702 may have difficulty in forming a via because the flex portion 702 is relatively less resistant to deformation and less stiffness as compared with the first rigid portion 701 and has a predetermined gap (e.g., g1 or g2), making it difficult to fill with a plating solution.

According to various embodiments of the disclosure, the bonding sheet layer 743 is formed on the second conductive layer 744, facilitating formation of vias in the flex portion 702 while more securely adhering the RF line-containing layers to thereby minimize RF impedance variations.

Figure 8A:
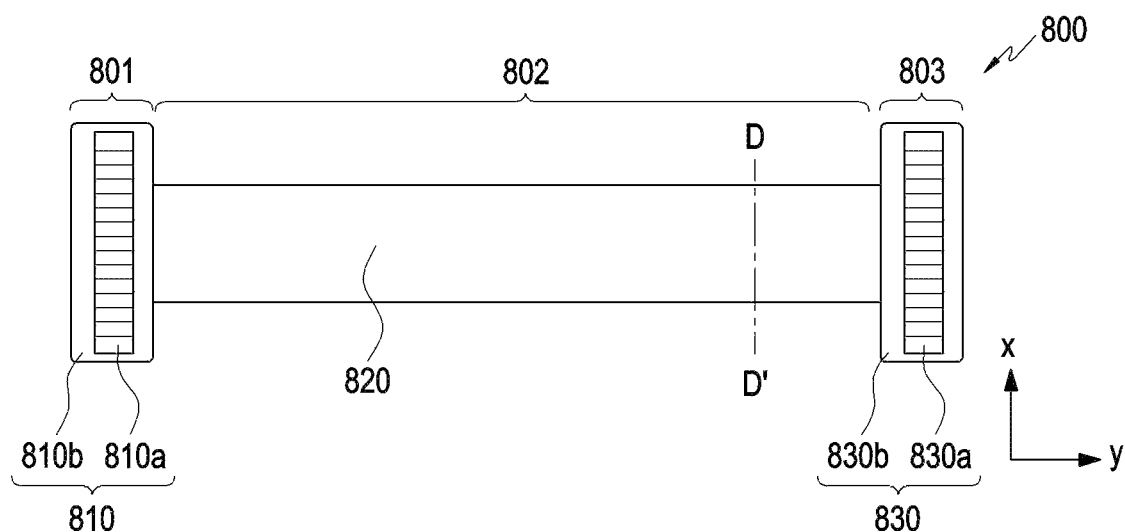
FIG. 8A is a view illustrating a flexible connection member having at least one side connected with a rigid circuit board, as viewed from above an upper surface according to other embodiments than those of FIG. 6A.
Figure 8B:
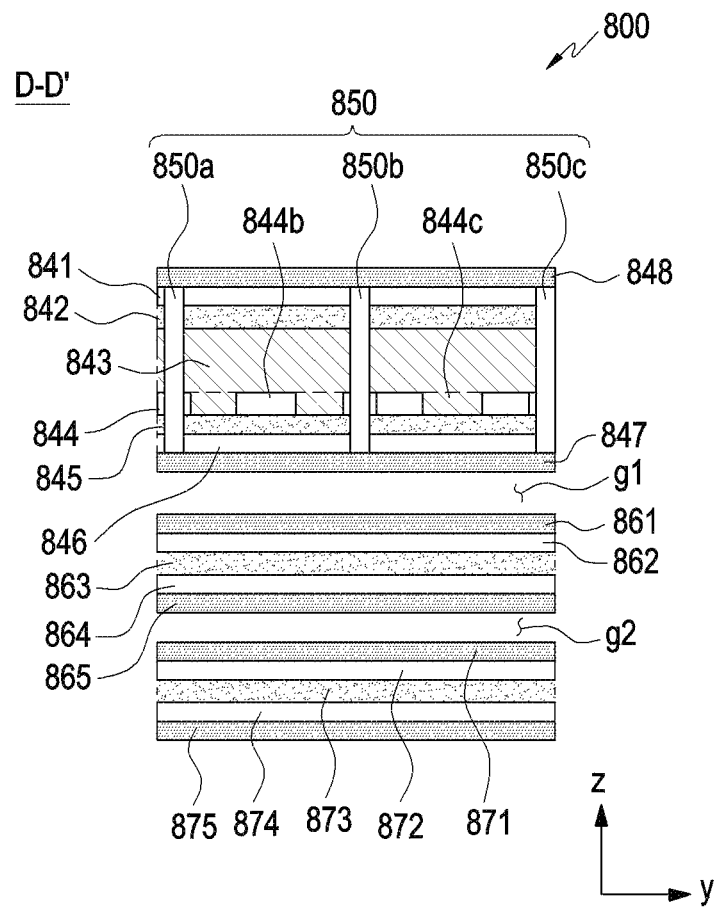
FIG. 8B is a cross-sectional view of the flexible connection member of FIG. 8A, taken along line D-D'.

FIG. 8A is a view illustrating a flexible connection member 800 having at least one side connected with a rigid circuit board, as viewed from above an upper surface according to other embodiments than those of FIG. 6A. FIG. 8B is a cross-sectional view of the flexible connection member 800 of FIG. 8A, taken along line D-D'.

According to FIG. 8A, the flexible connection member 800 may include a first connection end 810 including a plurality of pins 810*a* and a reinforcing material 810*b* and a second connection end 810 including a plurality of pins 830*a* and a reinforcing material 830*b*. In the embodiment illustrated in FIGS. 8A and 8B, a B-to-B type flexible connection member having two connector structures formed in the rigid portions 801 and 803 is shown. However, according to various embodiments of the disclosure, the flexible connection member 800 may alternatively include such a type of flexible connection member in which at least one end (e.g., the connection end 810 or 830) extends integrally with the circuit board. FIGS. 8A and 8B illustrate an embodiment in which the logic line and the RF line are not formed together on the same plane.

Referring to FIGS. 8A and 8B together, the flexible connection member 800 may include a first conductive layer 841 and a second conductive layer 844 that is positioned adjacent to the first conductive layer 841 and includes RF lines 844*b* and 844*c* and a bonding sheet layer 843. Here, the bonding sheet layer 843 may be adhered onto the RF lines 844*b* and 844*c*. Further, the flexible connection member 800 may include a first insulating layer 842 formed between the first conductive layer 841 and the second conductive layer 844. Of course, the flexible connection member 800, according to the embodiment illustrated in FIGS. 8A and 8B, also may further include at least one conductive layer (e.g., at least one of 846, 862, 864, 872, or 874) and at least one insulating layer (e.g., at least one of 845, 863, or 873) and may further include at least one coverlay (e.g., 847, 861, 865, 871, or 875).

According to various embodiments of the disclosure, it is possible to form at least one via 850*a* penetrating the layers included in the first conductive layer 841 and the second conductive layer 844 by including the bonding sheet layer 843 in the flexible connection member 800.

According to various embodiments, a ground may be formed on at least one of the conductive layers (e.g., at least one of 841 and 846), forming a stable ground structure.

According to various embodiments, the flexible connection member 800 according to FIGS. 8A and 8B may further include additional vias 850*b* and 850*c* around the RF lines 844*b* and 844*c*, and these vias 850*a*, 850*b*, and 850*c* may be formed to penetrate the first conductive layer 841, the second conductive layer 844, and the third conductive layer 846, so that the RF line 844*b*, 844*c* may be electromagnetically shielded.

Figure 9:
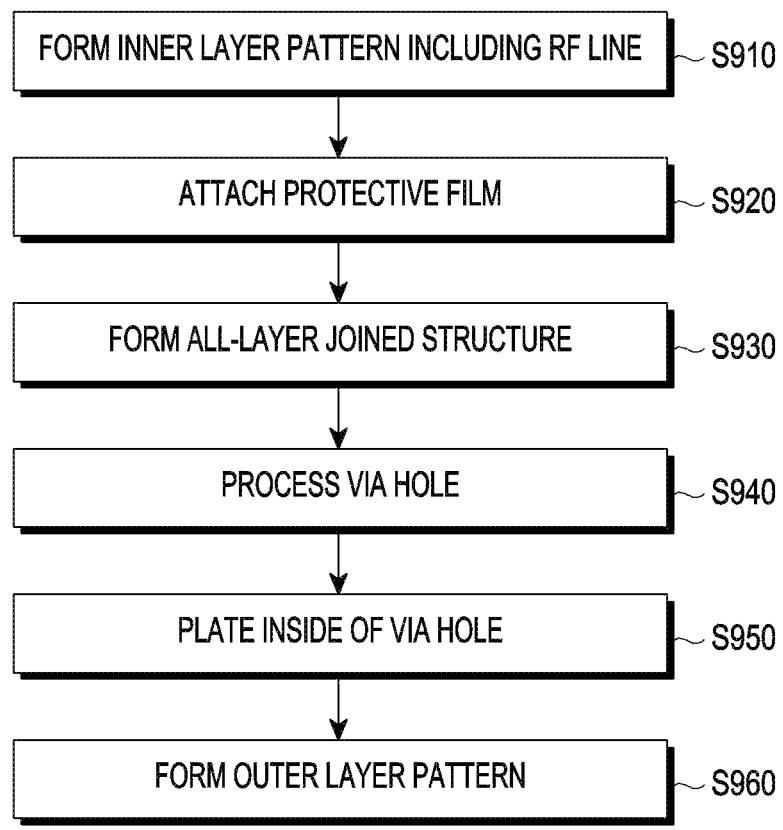
FIG. 9 is a flowchart illustrating a method for manufacturing a flexible connection member according to various embodiments of the disclosure.
Figure 10A:
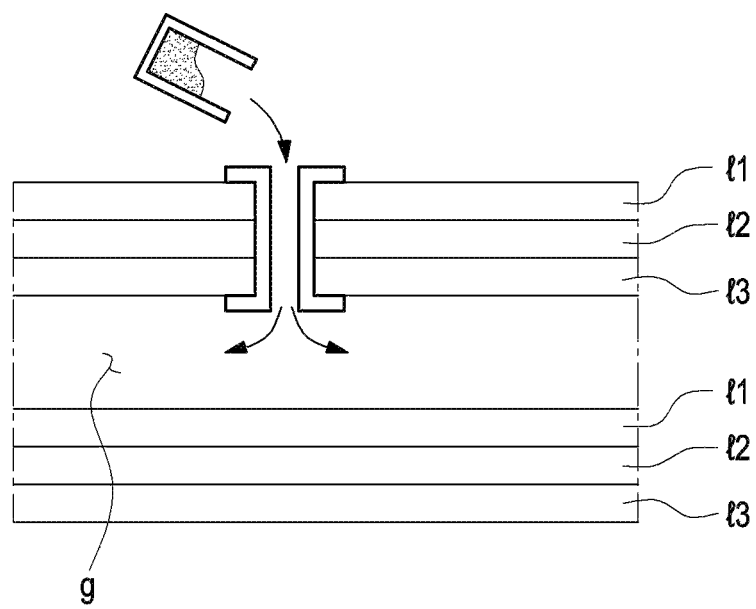
FIG. 10A is a concept view illustrating a process for forming a via in a multi-layered circuit board.
Figures 10B, 10C:
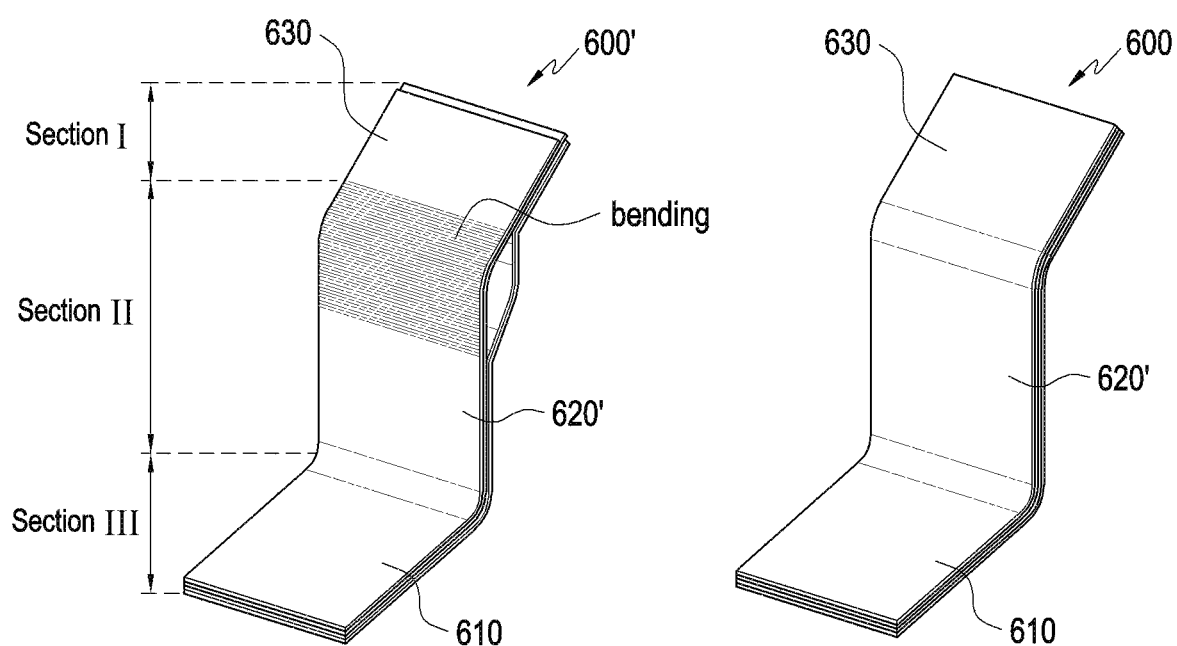
FIG. 10B is a perspective view illustrating a state when a flexible connection member without a bonding sheet layer is bent.
FIG. 10C is a perspective view illustrating a state when a flexible connection member with a bonding sheet layer is bent according to various embodiments of the disclosure.

FIG. 9 is a flowchart illustrating a method for manufacturing a flexible connection member (e.g., 600 of FIG. 6A) according to various embodiments of the disclosure. FIG. 10A is a concept view illustrating a process for forming a via (e.g., 650*a* of FIG. 6B) in a multi-layered circuit board. FIG. 10B is a perspective view illustrating a state when a flexible connection member (e.g., 600 of FIG. 6A) without a bonding sheet layer is bent. FIG. 10C is a perspective view illustrating a state when a flexible connection member (e.g., 600 of FIG. 6A) provided with a bonding sheet layer (e.g., 643 of FIG. 6B) is bent according to various embodiments of the disclosure.

Referring to FIG. 9, a method of manufacturing a flexible connection member (e.g., 600 of FIG. 6A), according to various embodiments of the disclosure, may include an operation S910 for forming an inner layer pattern including RF line and an operation S920 for attaching a protective film.

In relation to operation S910, an RF line or a plated layer (e.g., 641, 644, and 646 of FIG. 6A) on which RF line and logic line are formed may be formed. In relation to operation S920, an insulating layer (e.g., 642 of FIG. 6A) or a coverlay may be formed. A stacked structure including a plurality of plated layers, insulating layers, and coverlays may be formed through operations S910 and S920.

According to various embodiments, a method of manufacturing a flexible connection member (e.g., 600 of FIG. 6A) of the disclosure may include an operation S930 of forming an all-layer joined structure.

By including a bonding sheet layer (e.g., 643 of FIG. 6B) between the plated layer on which the RF line is formed and the insulating layer through operation S930, it is possible to form a solid stacked structure by increasing the resistance to deformation and rigidity of the plated layer on which the RF line is formed.

The method of manufacturing the flexible connection member (e.g., 600 in FIG. 6A) of the disclosure may include an operation S940 for processing a via hole (e.g., 650*a* of FIG. 6B) and an operation S950 for plating the inside of the via hole.

Referring to FIG. 10A in connection with operation S940 and operation S950, a conventional flexible circuit board is flexible and has a gap g (e.g., g1 and g2 in FIG. 6B) between stacked structures, so that it is difficult to drill a via hole and, even if a via hole is drilled, filling with a plating solution and solidifying may not be easy, rendering it difficult to form vias.

In contrast, according to various embodiments of the disclosure, a bonding sheet layer (e.g., 643 of FIG. 6B) is included between the plated layer having RF line formed thereon and the insulating layer, so that it is possible to form a via (e.g., 650*a* of FIG. 6A) in the flex portion (e.g., 602 of FIG. 6A) as if a via may be formed in the rigid portion (e.g., 601 of FIG. 6A) of the flexible connection member (e.g., 600 of FIG. 6A). The via (e.g., 650*a* of FIG. 6A) may be formed through an operation S940 for processing the via hole and an operation S950 for plating the inside of the via hole.

According to an embodiment, subsequent methods of manufacturing a flexible connection member including a flexible circuit board, including the operation S960 of forming an outer layer pattern, may be applied to manufacturing a flexible connection member as disclosed herein.

Referring to FIG. 10B, the flexible connection member 600 having a structure in which a plurality of layers are stacked may be divided into Section I in which the rigid portion 610 is formed, Section II in which the flex portion 620 is formed, and Section III in which the rigid portion 630 is formed. Each of Section I and Section III in which rigid portions are formed may be connected to a circuit board (e.g., the first circuit board (e.g., 510 of FIG. 5A) or the second circuit board (e.g., 520 of FIG. 5B). For example, in the case where the positions of the circuit boards mounted inside the electronic device are stepped from each other, a gap may occur between the stacked structures when at least a portion is bent in Section II as shown in FIG. 10B although shown in a slightly exaggerated manner.

According to the above-described manufacturing method, if the flexible connection member (e.g., 600 of FIG. 6A) including the joined structure is bent, the gap of the stacked structure in the curved surface may be minimized as illustrated in FIG. 10C.

Figure 11:
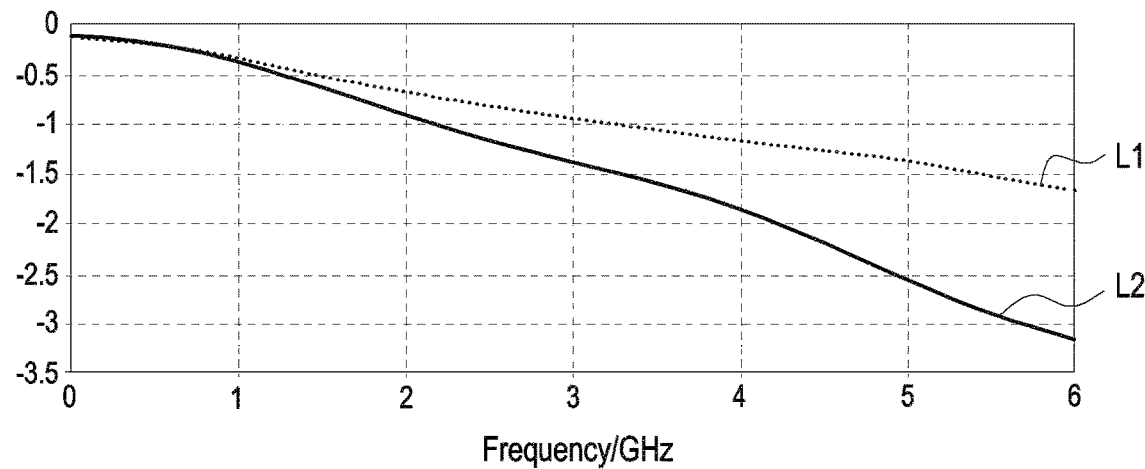
FIG. 11 is a graph illustrating impedance variations when a flexible connection member without a bonding sheet layer is bent.
Figure 12:
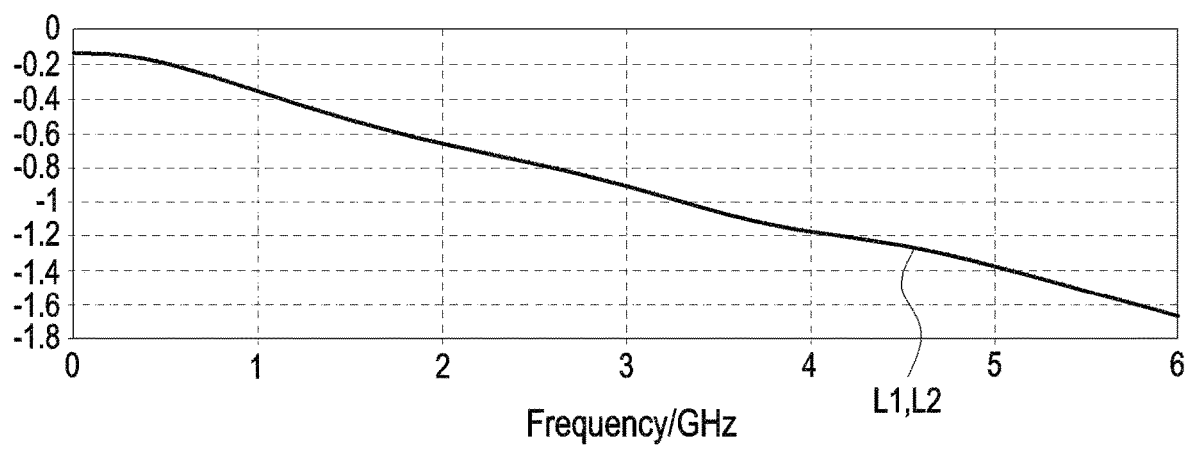
FIG. 12 is a graph illustrating impedance variations when a flexible connection member with a bonding sheet layer is bent according to various embodiments of the disclosure.

FIG. 11 is a graph illustrating impedance variations when a flexible connection member without a bonding sheet layer is bent. FIG. 12 is a graph illustrating impedance variations when a flexible connection member (e.g., 600 of FIG. 6A) provided with a bonding sheet layer (e.g., 643 of FIG. 6A) is bent according to various embodiments of the disclosure.

In FIGS. 11 and 12, the horizontal axis indicates the magnitude of the frequency, and the vertical axis may be the parameter indicating the impedance variation.

FIG. 11 illustrates a graph L1 of impedance variations when the frequency is increased with the flexible connection member placed in a flat state, and a graph L2 of impedance variations when the frequency is increased with the flexible connection member bent, and it may be identified therefrom that as the frequency increases, the frequency deviation due to bending of the flexible connection member increases.

Referring to FIG. 12, it is possible to identify the graph L1 of impedance variations obtained by increasing the frequency when the flexible connection member (e.g., 600 of FIG. 6A) is placed in a flat state and the graph L2 of impedance variations obtained by increasing the frequency when the flexible connection member (e.g., 600 of FIG. 6A) is in a bent state. Comparison between the impedance variation graphs L1 and L2 of FIG. 12 reveals that the impedance is constantly varied according to frequency variations regardless of the bent state of the flexible connection member (e.g., 600 of FIG. 6A).

The flexible connection members 600, 700, and 800 according to the above-described embodiments may be used to transmit and receive signals having frequencies of 6 GHz or more and 300 GHz or less. The impedance variations in RF signal may be amplified more rapidly as the frequency increases and may cause serious performance degradation in the electronic device (e.g., 101 of FIG. 1). However, use of the flexible connection members 600, 700, and 800 according to the above-described embodiments may minimize impedance variations.

According to various embodiments of the disclosure, there may be provided a connection member (e.g., 600 of FIG. 6A) comprising a first conductive layer (e.g., 641 of FIG. 6B) including a first logic line, a second conductive layer (e.g., 644 of FIG. 6B) positioned adjacent to the first conductive layer 641 and including a bonding sheet layer (e.g., 643 of FIG. 6B), the second conductive layer 644 including a second logic line (e.g., 644a of FIG. 6B) formed on a portion of the second conductive layer 644 and an RF line (e.g., 644b of FIG. 6B) formed on other portion of the second conductive layer 644, and the bonding sheet layer 643 adhered onto the second logic line 644a and the RF line 644b, a first insulating layer 642 formed between the first conductive layer 641 and the second conductive layer 644, and pins (610a of FIG. 6A) formed on a side of the first conductive layer 641 and the second conductive layer 644 and configured to be electrically connected with a connection pin of an external module. The second conductive layer 644 includes at least one via (e.g., 650a of FIG. 6B) formed between the second logic line 644a and the RF line 644b for conduction between layers included in the second conductive layer 644.

According to various embodiments, the connection member (e.g., 600 of FIG. 6A) may include a flexible printed circuit board (FPCB).

According to various embodiments, the second logic line 644a and the RF line 644b may be disposed on the same plane.

According to various embodiments, the connection member (e.g., 600 of FIG. 6A) may include a first region 621 and a second region 622 separated in a width direction of the connection member (e.g., 600 of FIG. The second logic line 644a may be formed on the first region 621, and the RF line 644b may be formed on the second region 621.

According to various embodiments, the connection member may include a second insulating layer 645 formed under the second conductive layer 644 and a third conductive layer 646 formed under the second insulating layer 645.

According to various embodiments, the first conductive layer 641 and the third conductive layer 646 may be electrically connected through the at least one via 650a.

According to various embodiments, the connection member may further comprise at least one conductive layer disposed to be physically spaced apart from the third conductive layer 646 and having a logic line formed thereon.

According to various embodiments, a coverlay or an insulating layer may be formed between conductive layers including the third conductive layer 646 and at least one conductive layer disposed under the third conductive layer 646.

According to various embodiments, the connection member may comprise at least one second via 650b disposed on a side opposite to the at least one via 650a, with respect to the RF line 644b, and around the RF line 644b.

According to various embodiments, the connection member may further comprise pins 610b formed on an opposite side of the first conductive layer 641 and the second conductive layer 644 and configured to be electrically connected to a connection pin of an external module.

According to various embodiments, the connection member may be electrically connected to a printed circuit board of an external module formed on the opposite side of the first conductive layer 641 and the second conductive layer 644.

According to various embodiments of the disclosure, there may be provided a connection member (e.g., 600 of FIG. 8A) comprising a first conductive layer (e.g., 841 of FIG. 8B), a second conductive layer (e.g., 844 of FIG. 8B) positioned adjacent to the first conductive layer 841 and including an RF line (e.g., 844b of FIG. 8B) and a bonding sheet layer (e.g., 843 of FIG. 8B), the bonding sheet layer 643 including the second conductive layer 844 adhered onto the RF line 644b, a first insulating layer 842 formed between the first conductive layer 841 and the second conductive layer 844, and pins (810a of FIG. 8A) formed on one side of the first conductive layer 841 and the second conductive layer 844 and configured to be electrically connected with an external module, and at least one via (e.g., 850a of FIG. 8B) formed through layers included in the first conductive layer 841 and the second conductive layer 844.

According to various embodiments, the connection member (e.g., 800 of FIG. 8A) may include a flexible printed circuit board (FPCB).

According to various embodiments, the connection member may include a second insulating layer 845 formed under the second conductive layer 844 and a third conductive layer 846 formed under the second insulating layer 845.

According to various embodiments, the first conductive layer 841 and the third conductive layer 846 may be electrically connected through the at least one via 850a.

According to various embodiments of the disclosure, there may be provided an electronic device (e.g., 101 of FIG. 1) comprising a housing, a first circuit board contained in the housing and including a processor, a second circuit board contained in the housing, including a communication device, and electrically connected with the first circuit board, and a flexible connection member having at least a portion electrically connected with the first circuit board and the second circuit board. The flexible connection member includes a first conductive layer forming a ground and a second conductive layer including an RF line. The second conductive layer includes a bonding sheet layer on the RF line, forming a joined structure on the first conductive layer and the second conductive layer. At least one via is formed through the first conductive layer and the second conductive layer.

According to various embodiments, the communication device may have a frequency of 6 GHz or more and 300 GHz or less.

According to various embodiments, the second conductive layer may include a logic line disposed on the same plane as the RF line, and the at least one via may be formed between the logic line and the RF line.

According to various embodiments, the flexible connection member may further include pins configured to be electrically connected to a connection pin formed on the first circuit board or the second circuit board.

According to various embodiments, the flexible connection member may extend from at least one of the first circuit board and the second circuit board.

While the disclosure has been shown and described with reference to exemplary embodiments thereof, it will be apparent to those of ordinary skill in the art that various changes in form and detail may be made thereto without departing from the spirit and scope of the disclosure as defined by the following claims.

The invention claimed is:

1. A connection member comprising:
a first conductive layer including a first logic line;
a second conductive layer positioned adjacent to the first conductive layer and including a bonding sheet layer, the second conductive layer including a second logic line formed on a portion of the second conductive layer and an RF line formed on other portion of the second conductive layer, and the bonding sheet layer adhered onto the second logic line and the RF line;
a first insulating layer formed between the first conductive layer and the second conductive layer; and
pins formed on a side of the first conductive layer and the second conductive layer and configured to be electrically connected with a connection pin of an external module,
wherein the second conductive layer includes at least one via formed between the second logic line and the RF line for conduction between layers included in the second conductive layer,
wherein the connection member comprises a flexible printed circuit board (FPCB),
wherein the first conductive layer is disposed on the first insulating layer, and the first insulating layer is disposed on the second conductive layer, and
wherein the connection member has a first region and a second region separated in a width direction of the connection member, and wherein the second logic line is formed on the first region, and the RF line is formed on the second region.

2. The connection member of claim 1, wherein the second logic line and the RF line are disposed on the same plane.

3. The connection member of claim 1, comprising a second insulating layer formed under the second conductive layer and a third conductive layer formed under the second insulating layer.

4. The connection member of claim 3, wherein the first conductive layer and the third conductive layer are electrically connected through the at least one via.

5. The connection member of claim 3, further comprising at least one conductive layer disposed to be physically spaced apart from the third conductive layer and having a logic line formed thereon.

6. The connection member of claim 5, wherein a coverlay or an insulating layer is formed between conductive layers including the third conductive layer and at least one conductive layer disposed under the third conductive layer.

7. The connection member of claim 1, comprising at least one second via disposed on a side opposite to the at least one via, with respect to the RF line, and around the RF line.

8. The connection member of claim 1, further comprising pins formed on an opposite side of the first conductive layer and the second conductive layer and configured to be electrically connected to a connection pin of an external module.

9. The connection member of claim 1, wherein the connection member extends from a printed circuit board of an external module formed on an opposite side of the first conductive layer and the second conductive layer.

10. An electronic device comprising:
a connection member comprising:
a first conductive layer including a first logic line,
a second conductive layer positioned adjacent to the first conductive layer and including a bonding sheet layer, the second conductive layer including a second logic line formed on a portion of the second conductive layer and an RF line formed on other portion of the second conductive layer, and the bonding sheet layer adhered onto the second logic line and the RF line,
a first insulating layer formed between the first conductive layer and the second conductive layer, and
pins formed on a side of the first conductive layer and the second conductive layer and configured to be electrically connected with a connection pin of an external module,
wherein the second conductive layer includes at least one via formed between the second logic line and the RF line for conduction between layers included in the second conductive layer, wherein the connection member comprises a flexible printed circuit board (FPCB), wherein the first conductive layer is disposed on the first insulating layer, and the first insulating layer is disposed on the second conductive layer, and wherein the connection member has a first region and a second region separated in a width direction of the connection member, and wherein the second logic line is formed on the first region, and the RF line is formed on the second region, a housing;

a first circuit board contained in the housing and including a processor; and a second circuit board contained in the housing, including a communication device, and electrically connected to the first circuit board, wherein at least a portion of the connection member is electrically connected to the first circuit board and the second circuit board.

11. The electronic device of claim 10, wherein the communication device is configured to transmit and receive a signal having a frequency between 6 GHz and 300 GHz.

12. The electronic device of claim 10, wherein the connection member further includes pins configured to be electrically connected to a connection pin formed in at least one of the first circuit board or the second circuit board.

13. The electronic device of claim 10, wherein the connection member extends from at least one of the first circuit board and the second circuit board.

\* \* \* \* \*